(12) United States Patent
Matsuoka et al.

(10) Patent No.: US 7,661,894 B2
(45) Date of Patent: Feb. 16, 2010

(54) COATING AND DEVELOPING APPARATUS, AND COATING AND DEVELOPING METHOD

(75) Inventors: Nobuaki Matsuoka, Koshi (JP); Mitsuhiro Tanoue, Koshi (JP); Shinji Okada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 674 days.

(21) Appl. No.: 11/523,015

(22) Filed: Sep. 19, 2006

(65) Prior Publication Data
US 2007/0089673 A1   Apr. 26, 2007

(30) Foreign Application Priority Data
Oct. 19, 2005   (JP)   ............... 2005-304696

(51) Int. Cl.
*G03D 5/00*   (2006.01)
*G03B 27/32*  (2006.01)
*B05C 11/02*  (2006.01)
*B05C 13/02*  (2006.01)

(52) U.S. Cl. .................... 396/611; 355/27; 118/52; 118/66

(58) Field of Classification Search ........... 396/611; 355/27; 118/52, 66; 700/121
See application file for complete search history.

(56) References Cited

U.S. PATENT DOCUMENTS

| | | | |
|---|---|---|---|
| 6,454,472 B1 * | 9/2002 | Kim et al. | 396/611 |
| 7,379,785 B2 * | 5/2008 | Higashi et al. | 700/112 |
| 2003/0012575 A1 * | 1/2003 | Ueda et al. | 396/611 |
| 2003/0133086 A1 * | 7/2003 | Senba et al. | 355/27 |
| 2006/0162646 A1 * | 7/2006 | Akimoto et al. | 118/52 |
| 2006/0201615 A1 * | 9/2006 | Matsuoka et al. | 156/272.2 |

FOREIGN PATENT DOCUMENTS

| | | |
|---|---|---|
| JP | 3337677 | 8/2002 |
| JP | 2004-193597 | 7/2004 |

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

A processing block S2 includes unit blocks, a BCT layer B3, COT layer B4 and TCT layer B5, for forming coating films, and further includes DEV layers B1, B2 layered with the unit blocks B3, B4, B5 and used as unit blocks for a developing process. Beside the unit blocks B1 to B5, a group G of transfer sections comprising transfer sections adapted to transfer each wafer W with each main arm A1 to A5 of the unit block B1 to B5 and hydrophobicity rendering units adapted to provide a hydrophobicity rendering process to the wafer W is provided. The wafer W is transferred by a transfer arm D between the transfer sections and the hydrophobicity rendering units. In this case, since it is not necessary to transfer the wafer W to the hydrophobicity rendering unit by using, for example, a main arm A4 of a COT layer B4, the load on the arm A4 can be reduced, thereby enhancing the carrying throughput.

9 Claims, 16 Drawing Sheets

COATING AND DEVELOPING APPARATUS, AND COATING AND DEVELOPING METHOD

BACKGROUND OF THE INVENTION

1. Field of the Invention

The present invention relates to a process for coating a resist liquid on a substrate, such as semiconductor wafers or LCD substrates (glass substrates for Liquid Crystal Displays), and also relates to a coating and developing apparatus and a coating and developing method for performing a developing process after exposure.

2. Background Art

In a process for producing semiconductor devices and LCD substrates, formation of a resist pattern on each substrate is performed employing a technique called photolithography. For example, this technique is achieved through a series of steps including: coating a resist liquid on each substrate, such as a semiconductor wafer (hereinafter referred to as a wafer) so as to form a resist liquid film on the substrate of the wafer, exposing the resist film with a photo-mask, and performing a developing process to obtain a desired pattern.

This process is generally carried out by using a resist pattern forming apparatus including a coating and developing apparatus for performing coating and developing a resist liquid, and an exposing apparatus. As such an apparatus, for example, an apparatus disclosed in Patent Document No. 1 is known, wherein, as shown in FIG. 16, for example, a carrier 10 containing plural sheets of wafers W is carried in a carrier stage 11 of a carrier block 1A, and each wafer W in the carrier 10 is then transferred to a processing block 1B via a transfer arm 12. Thereafter, the wafer W is carried into a coating unit 13A in the processing block 1B, a resist liquid is coated thereon, and the wafer W is carried into an exposing apparatus 1D via an interface block 1C.

After the exposing process, the wafer W is returned to the processing block 1B, subjected to a developing process in a developing unit 13B, and then returned to the original carrier 10. In the drawing, reference numerals 14 (14a to 14c) respectively designate rack units each comprising a heating unit, a cooling unit, a hydrophobicity rendering unit, a transferring stage or the like, for providing a predetermined heating process or cooling process to each wafer before and after the process in the coating unit 13A or developing unit 13B. The wafer W is carried between modules including the coating unit 13A, developing unit 13B and rack units 14a to 14c due to two carrying means 15A, 15B provided in the processing block 1B. Namely, in the processing block 1B, the wafer W is carried between the modules into which the wafer W is successively fed.

Depending on types of the resist film to be formed, in the case where the resist film and an antireflection film are laminated on the wafer W, or in the case where only the resist film is formed but the antireflection film is not formed on the waver W, or in the case where the antireflection film is formed prior to providing the resist film or coating the resist liquid on the wafer W, the hydrophobicity rendering process may be necessary or unnecessary. Also, the coating unit and hydrophobicity rendering unit must be changed to accommodate each lot with alteration of such film forming conditions.

In this case, if providing, in each processing block, all modules required for a coating process for forming an intended resist film, including a coating unit, a developing unit, a hydrophobicity rendering unit, a heating unit, a cooling unit and the like, in accordance with each coating mode, the number of modules to be incorporated in one processing block is significantly increased. Thus, if carrying wafers W by using a common carrying system through such a processing block, the number of modules to be accessed becomes quite greater, thus rendering obtainment of higher throughput difficult.

The present inventor has attempted to enhance throughput of the coating and developing apparatus by vertically dividing a processing block into one area for performing a coating process by housing modules to be employed prior to the exposing process in the area and the other area for performing a developing process by housing modules to be employed after the exposing process therein. In addition, by providing carrying means in the respective areas, it has been attempted to reduce the load on each carrying means and enhance carrying efficiency, thereby enhancing the throughput of the coating and developing apparatus. This vertical arrangement of the one area for performing the coating process and the other area for performing the developing process as well as the provision of carrying means for the respective areas are described in Patent Document 2.

However, even also in the Patent Document 2, if providing, all modules required for a coating process, such as a coating unit, a unit for forming an antireflection film, a hydrophobicity rendering unit and the like, in the area of performing the coating process, the number of modules to be incorporated in the area for performing the coating process is significantly increased. Therefore, the load imposed on the carrying means for this area becomes still greater, thus rendering achievement of higher throughput considerably difficult.

Additionally, in such a configuration that the area for performing the coating process and the area for performing the developing process are vertically arranged, each area must be thinned to some extent. Therefore, when incorporating modules in such areas in a multi-staged fashion, the number of modules to be incorporated can not be increased as desired. Namely, the number of modules to be provided in each area is significantly restricted. Additionally, in the area for performing the resist coating process, in order to enhance the throughput, it is desired to increase the number of heating units for performing heating processes after coating the resist liquid. However, in the area for performing the coating process, adding to these heating units, it is also necessary to incorporate a hydrophobicity rendering unit, a cooling unit, a periphery exposing apparatus and the like. Therefore, in reality, it is quite difficult to increase the number of heating units as desired.

Patent Document 1:
TOKUKAI No. 2004-193597, KOHO

Patent Document 2:
Japanese Patent No. 3337677, KOHO

SUMMARY OF THE INVENTION

The present invention was made in light of the above situation, and therefore it is an object to provide a technique for reducing a load on a carrying means for each unit block upon performing a hydrophobicity rendering process so as to enhance the throughput of the carrying work.

The present invention is a coating and developing apparatus including a processing block adapted to receive a substrate from a carrier on a carrier block and form coating films including a resist film, wherein the substrate having coating films formed in the processing block thereon is carried into an exposing apparatus via an interface block, and the substrate after exposed and returned via the interface block is developed in the processing block and then transferred to the carrier block, wherein (a) the processing block comprises unit blocks for forming a plurality of coating films and unit blocks for a developing process, which are layered with one another, wherein (b) the unit blocks for forming coating films comprise unit blocks for coating a resist liquid on each substrate, and unit blocks for coating a chemical liquid for forming an antireflection film on the substrate, wherein (c) each of the unit blocks for forming coating films and the unit blocks for a developing process comprises a liquid processing unit for coating a chemical liquid on the substrate, a heating unit for heating the substrate, and a carrying means for each unit block, which is adapted to carry the substrate between the liquid processing unit and the heating unit, and wherein (d) a group of transfer sections, comprising transfer sections adapted to transfer the substrate to the carrying means of each unit block and hydrophobicity rendering units layered with the transfer sections and adapted to provide a hydrophobicity rendering process to the substrate, is provided on the side of the carrier block of the unit blocks for forming coating films and unit blocks for a developing process, and a substrate transfer means adapted to transfer the substrate between the transfer sections and the hydrophobicity rendering units is further provided.

The present invention is the coating and developing apparatus, wherein the group of transfer sections includes a temperature control unit on which a substrate prior to forming coating films thereon is placed and which adjusts the temperature of the substrate to a temperature at which a process of coating a chemical liquid for forming a coating film is performed.

The present invention is the coating and developing apparatus, wherein the temperature control unit includes a first temperature control plate on which a substrate is placed and which adjusts roughly the temperature of the substrate to a first temperature, and a second temperature control plate on which the substrate is placed and which adjusts more precisely the temperature of the substrate.

The present invention is the coating and developing apparatus, wherein the temperature of the second temperature control plate is controlled with a liquid flowing in a pipe, with the temperature of the liquid being adjusted to a predetermined temperature, and wherein the first temperature control plate is attached to a heating pipe adapted to transfer the temperature of the liquid to the first temperature control plate, the heating pipe being in connection with a pipe through which the liquid flows.

The present invention is a coating and developing apparatus including a processing block adapted to receive a substrate from a carrier on a carrier block and form coating films including a resist film, wherein the substrate having coating films formed in the processing block thereon is carried into an exposing apparatus via an interface block, and the substrate after exposed and returned via the interface block is developed in the processing block and then transferred to the carrier block, wherein (a) the processing block comprises unit blocks for forming a plurality of coating films and unit blocks for a developing process, which are layered with one another, wherein (b) the unit blocks for forming coating films comprise unit blocks for coating a resist liquid on each substrate, and unit blocks for coating a chemical liquid for forming an antireflection film on the substrate, wherein (c) each of the unit blocks for forming coating films and the unit blocks for a developing process comprises a liquid processing unit for coating a chemical liquid on the substrate, a heating unit for heating the substrate, and a carrying means for each unit block, which is adapted to carry the substrate between the liquid processing unit and the heating unit, and wherein (d') a group of transfer sections, comprising transfer sections adapted to transfer the substrate to the carrying means of each unit block and hydrophobicity rendering units layered with the transfer sections and adapted to provide a hydrophobicity rendering process to the substrate, is provided on the side of the interface block side of the unit blocks for forming coating films and unit blocks for a developing process, and a substrate transfer means adapted to transfer the substrate between the transfer sections and the hydrophobicity rendering units is further provided.

The present invention is the coating and developing apparatus, wherein the group of transfer sections includes a temperature control unit on which a substrate prior to forming coating films thereon is placed and which adjusts the temperature of the substrate to a temperature at which a process of coating a chemical liquid for forming a coating film is performed.

The present invention is the coating and developing apparatus, wherein the temperature control unit includes a first temperature control plate on which a substrate is placed and which adjusts roughly the temperature of the substrate to a first temperature, and a second temperature control plate on which the substrate is placed and which adjusts more precisely the temperature of the substrate.

The present invention is the coating and developing apparatus, wherein the temperature of the second temperature control plate is controlled with a liquid flowing in a pipe, with the temperature of the liquid being adjusted to a predetermined temperature, and wherein the first temperature control plate is attached to a heating pipe adapted to transfer the temperature of the liquid to the first temperature control plate, the heating pipe being in connection with a pipe through which the liquid flows.

The present invention is a coating and developing method of using a coating and developing apparatus including a processing block adapted to receive a substrate from a carrier on a carrier block and form coating films including a resist film, wherein the substrate having coating films formed in the processing block thereon is carried into an exposing apparatus via an interface block, and the substrate after exposed and returned via the interface block is developed in the processing block and then transferred to the carrier block, wherein (a) the processing block comprises unit blocks for forming a plurality of coating films and unit blocks for a developing process, which are layered with one another, wherein (b) the unit blocks for forming coating films comprise unit blocks for coating a resist liquid on each substrate, and unit blocks for coating a chemical liquid for forming an antireflection film on the substrate, wherein (c) each of the unit blocks for forming coating films and the unit blocks for a developing process comprises a liquid processing unit for coating a chemical liquid on the substrate, a heating unit for heating the substrate, and a carrying means for each unit block, which is adapted to carry the substrate between the liquid processing unit and the heating unit, and wherein (d) a group of transfer sections, comprising transfer sections adapted to transfer the substrate to the carrying means of each unit block and hydrophobicity rendering units layered with the transfer sections and adapted to provide a hydrophobicity rendering process to the substrate, is provided on the side of the carrier block of the unit blocks for forming coating films and unit blocks for a developing process, and a substrate transfer means adapted to transfer the substrate between the transfer sections and the hydrophobicity rendering units is further provided, the method comprising the steps of: carrying the substrate which has been subjected to a hydrophobicity rendering process in the hydrophobicity rendering unit into the unit block for forming a coating film, and coating a resist liquid on the substrate; and providing a developing process in the unit block for a developing process to the substrate which has been coated with the resist liquid and exposed.

In the present invention described above, since the transfer sections each adapted to transfer each substrate between the unit blocks and the carrying means as well as the hydrophobicity rendering units each adapted to provide a hydrophobicity rendering process to the substrate are provided in a layered fashion, the substrate can be transferred to the hydrophobicity rendering units via a substrate transfer means. Therefore, in the case of providing a hydrophobicity rendering process to each substrate, there is no need for transferring the substrate to each hydrophobicity rendering unit by using a carrying means of each unit block, as such the load on the carrying means can be reduced, leading to enhancement of the carrying efficiency of the carrying means, thereby achieving higher throughput for that enhancement.

In addition, since there is no need of providing any hydrophobicity rendering unit in each unit block, other modules can be further incorporated therein for such a saved space, thereby increasing modules intended to enhance the throughput in each unit block without upsizing the apparatus itself.

By providing the temperature control units in the vicinity of the hydrophobicity rendering units, the transfer of each substrate between the hydrophobicity rendering units and the temperature control units can be performed by using a substrate transfer means. Thus, in the case where a substrate is carried into the temperature control unit between the hydrophobicity rendering process and the resist coating process, the load to be imposed on a carrying means of each unit block can be reduced, thereby enhancing the throughput.

DETAILED DESCRIPTION OF THE INVENTION

EXAMPLES

Figure 1:
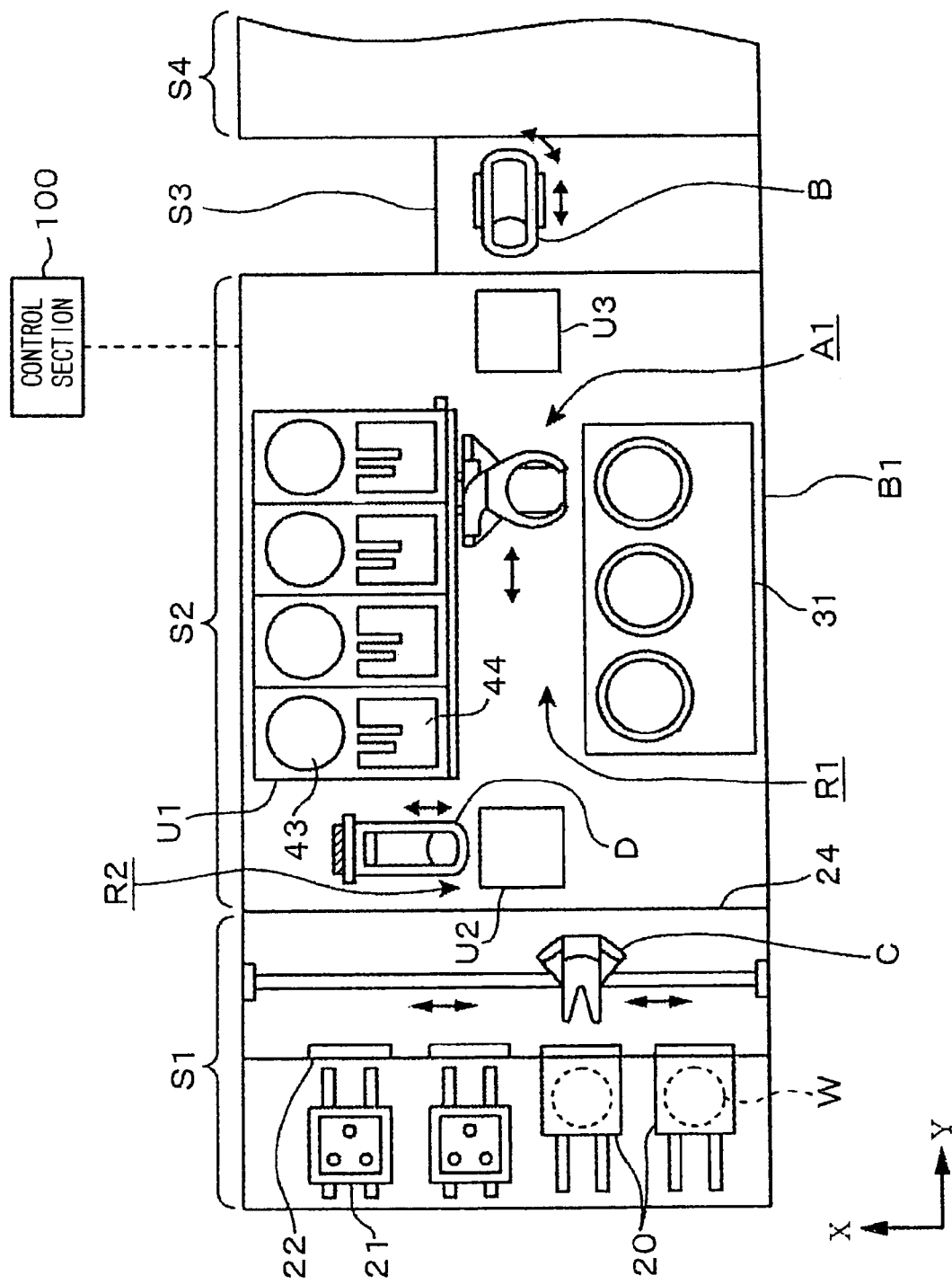
FIG. 1 is a plan view showing one embodiment of a coating and developing apparatus which relates to the present invention.
Figure 2:
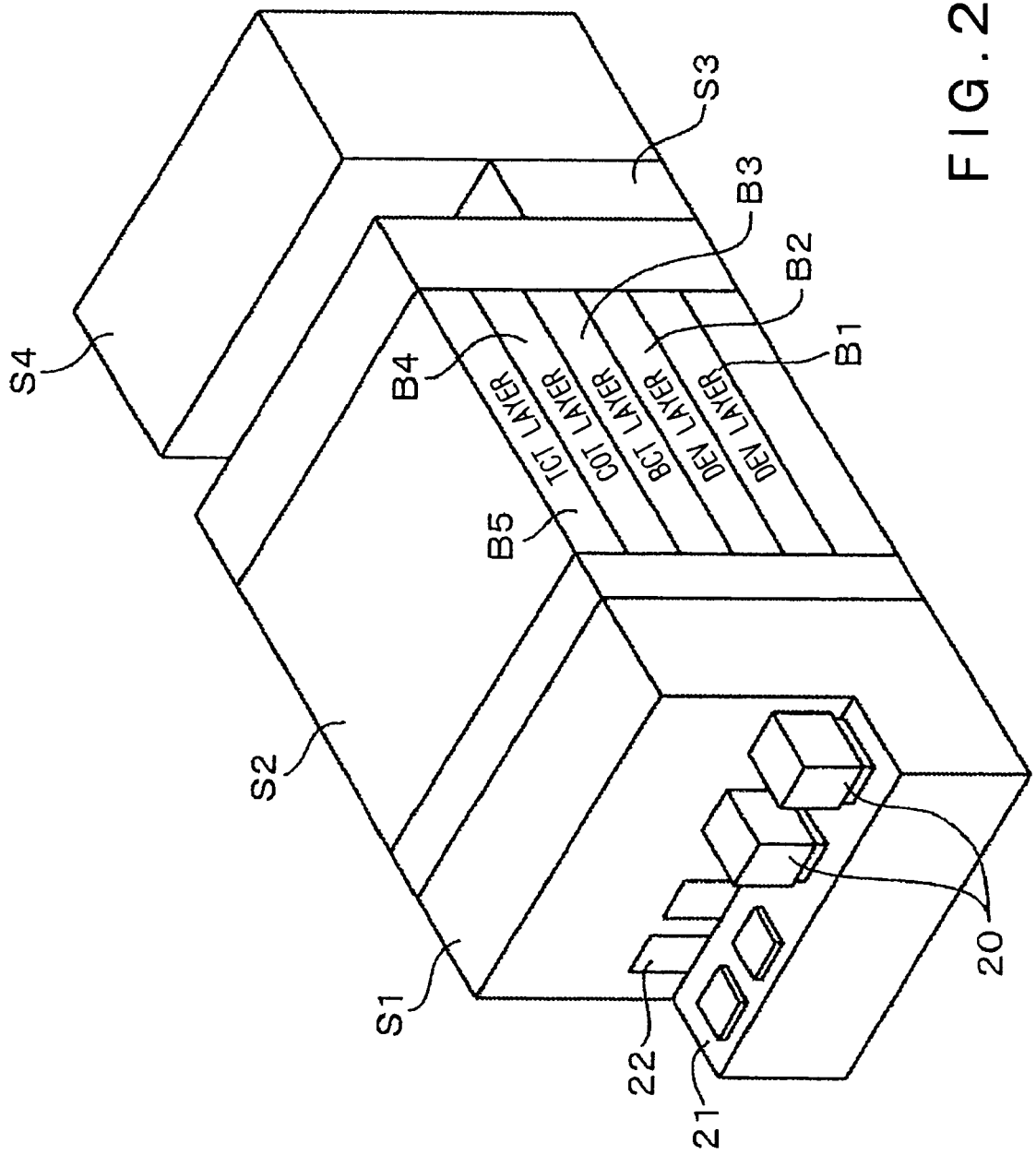
FIG. 2 is a perspective view showing the coating and developing apparatus.
Figure 3:
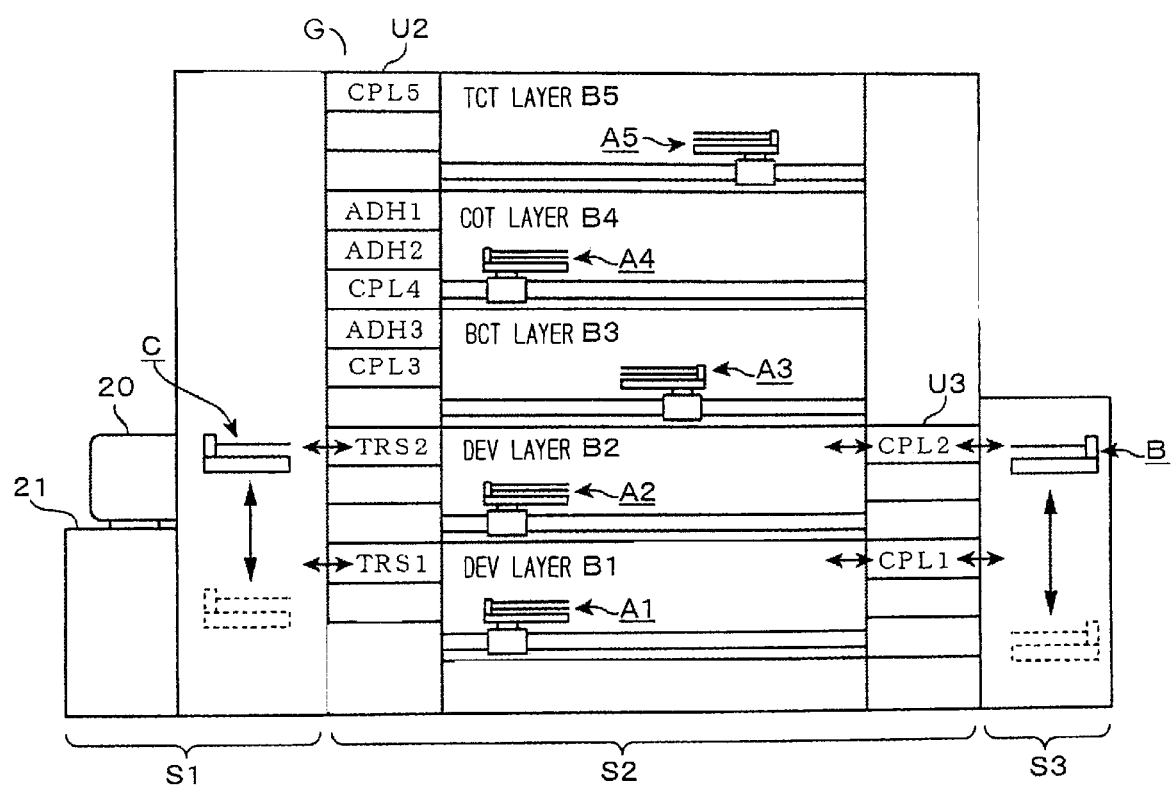
FIG. 3 is a side cross section showing the coating and developing apparatus.

Hereinafter, a first embodiment of a coating and developing apparatus relating to the present invention will be described. FIG. 1 is a plan view of the first embodiment in which the coating and developing apparatus of this invention is applied to a resist pattern forming apparatus, FIG. 2 is a perspective view of the same, and FIG. 3 is a schematic side view of the same. This apparatus comprises a carrier block S1 for carrying in and carrying out carriers 20 in each of which, for example, thirteen sheets of wafers W used respectively as substrates are contained, a processing block S2 configured by arranging vertically a plurality of, for example, five, unit blocks B1 to B5, and an interface block S3, and this apparatus is connected to an exposing apparatus S4.

In the carrier block S1, mounting tables 21 on each of which the carriers 20 can be placed in large numbers, opening and closing sections 22 provided on a front side face when viewed from the mounting tables 21, and a transfer arm C for taking out a wafer W from each carrier 20 via the opening and closing section 22 are provided. The transfer arm C is configured such that it can be optionally moved in the front and back directions as well as in the vertical direction and can be rotated about the vertical axis and also moved in the direction along which the carriers 20 are arranged, whereby it can receive and transfer each wafer W from and to a transfer stages TRS1, TRS2 of unit blocks B1, B2 described below.

On the front side of the carrier block S1, the processing block S2 surrounded by a housing 24 is arranged. In this example, as shown in FIG. 2, the processing block S2 includes first and second unit blocks (DEV layers) B1, B2 each adapted to perform a developing process, a third unit block (BCT layer) B3 adapted to form an antireflection film (hereinafter, referred to as a first antireflection film) to be provided on the lower layer side of a resist film, a fourth unit block (COT layer) B4 adapted to perform a coating process of a resist liquid, and a fifth unit block (TCT layer) B5 adapted to form an antireflection film (hereinafter, referred to as a second antireflection film) to be provided on the upper layer side of a resist film, these blocks being arranged successively from below. In this case, the DEV layers B1, B2 correspond to unit blocks employed for a development process, while the BCT layer B3, COT layer B4 and TCT layer B5 respectively correspond to unit blocks for forming coating firms, and these unit blocks B1 to B5 are divided from one another. Namely, a coating and developing apparatus is composed of the processing block S2.

Next, the configuration of the first to fifth blocks B (B1 to B5) will be described. Each of the unit blocks B1 to B5 includes a liquid processing unit 31, 32 adapted to coat a chemical liquid on each wafer W, various modules, such as a heating unit PEB, POST and a cooling unit COL each adapted to perform pre-treatment and post-treatment for the treatment performed in the liquid processing unit, and a corresponding main arm A1 to A5 which is an exclusive carrying means for use in transfer of each wafer W between the liquid processing units and the various modules.

Each of the unit blocks B1 to B5 is configured such that the layout of arranging the liquid processing unit, heating unit and carrying means is the same. The wording "the layout of arranging is the same" means that the center of placing a wafer W in each processing unit, i.e., the center of an spin chuck described below in each liquid processing unit or the center of a heating plate in each heating unit is the same.

Since the DEV layers B1, B2 are configured similarly, only the DEV layer B1 is explained here. In a substantially central portion of the DEV layer B1, a carrying area R1 for each wafer W in order for connecting the carrier block S1 and the interface block S3 is provided along a longitudinal direction (Y axis direction in the drawing) of the DEV layer B1.

On the right side, when viewed from the carrier block S1, of the carrying area R1, a developing unit 31 as one of the liquid processing units extends from the front side (the side of carrier block S1) to the back side, which comprises a plurality of developing sections for performing respective developing processes. On the left side, a rack unit U1 extends from the front side to the back side, which is composed of various modules arranged, for example, in a fashion of two stages by four rows. In the drawing, various modules for performing pre-treatments and post-treatments for the processes to be performed in the developing unit 31 are provided in the rack unit U1. In such a manner, the carrying area R1 is provided between the developing unit 31 and the rack unit U1. For example, by ejecting and discharging clean air in the carrying area R1, floating of particles in this area can be controlled.

Figure 4:
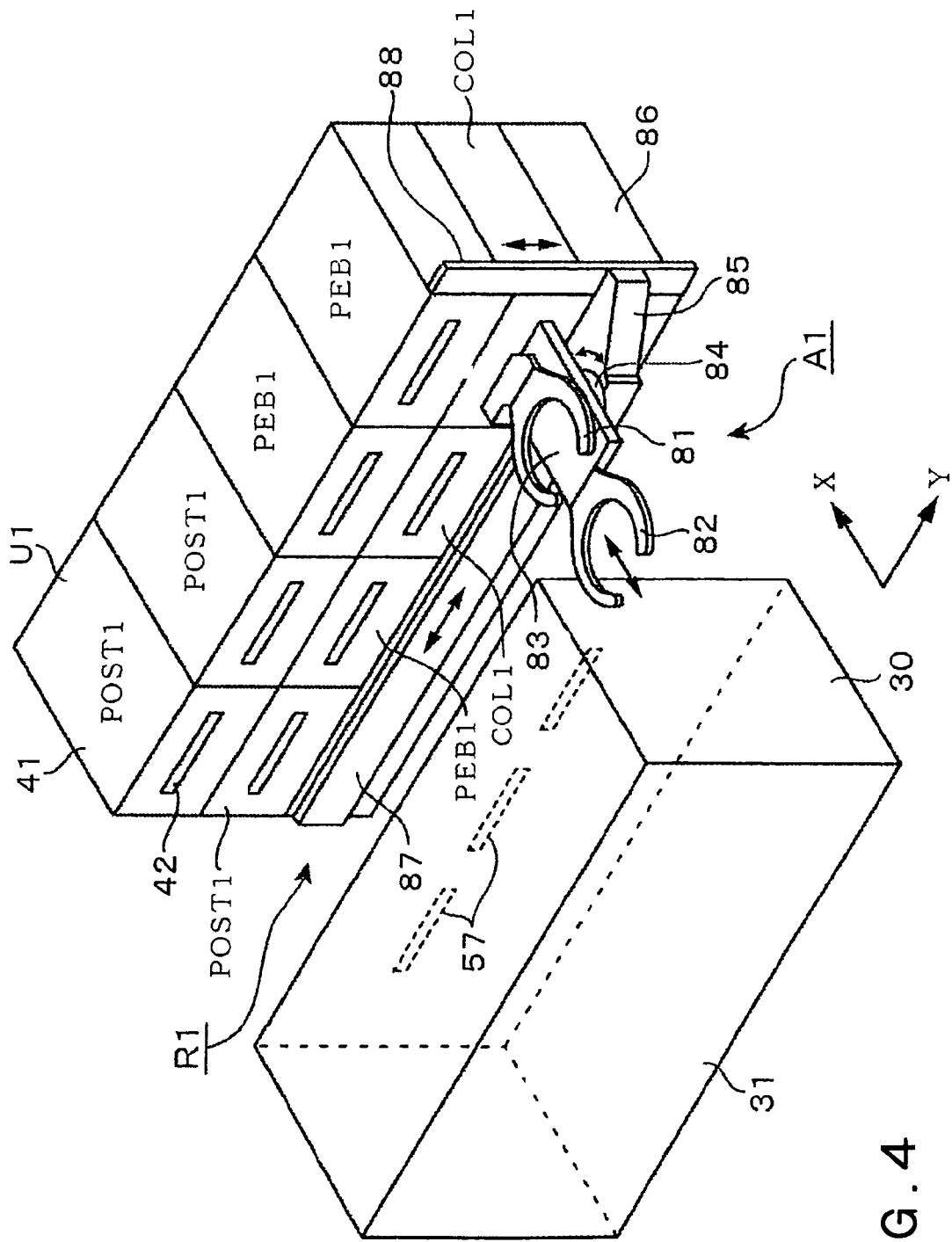
FIG. 4 is a perspective view showing developing units, rack units and carrying means in the coating and developing apparatus.

In each of the modules for performing the pre-treatments and post-treatments, for example, as shown in FIG. 4, a heating unit (PEB1) also referred to as a post-exposure-baking units for heating each wafer W after exposed, a cooling unit (COL1) for controlling the temperature of each wafer W to a predetermined temperature after the process of each heating unit (PEB1), and a heating unit (POST1) also referred to as a post-baking units for heating each wafer W after developed so as to remove moisture therefrom are included. These heating units (PEB1, POST1) and cooling units (COL1) are respectively housed in processing chambers 41, and a wafer entrance 42 is formed in a side of each processing chamber 41 facing the carrying area R1.

For each carrying area R1, the main arm A1 described above is provided. The main arm A1 is configured to transfer a wafer between all modules in the DEV layer B1 (i.e., locations on which each wafer is placed), for example, between respective modules of the rack units U1 to U3, developing unit 31, and respective sections of a rack unit U2 and a rack unit U3 described below. Thus, the main arm A1 is configured such that it can be optionally moved in the front and back directions as well as in the vertical direction and can be rotated about the vertical axis and also moved along the Y axis direction.

An area defined between the carrying area R1 and the carrier block S1 is a first wafer transfer area R2. In this area R2, as shown in FIGS. 1 and 3, the rack unit U2 is provided at a position that both the transfer arm C and the main arm A1 can access, and a transfer arm D is provided as a substrate transfer means adapted to transfer each wafer W to the rack unit U2.

Figure 5:
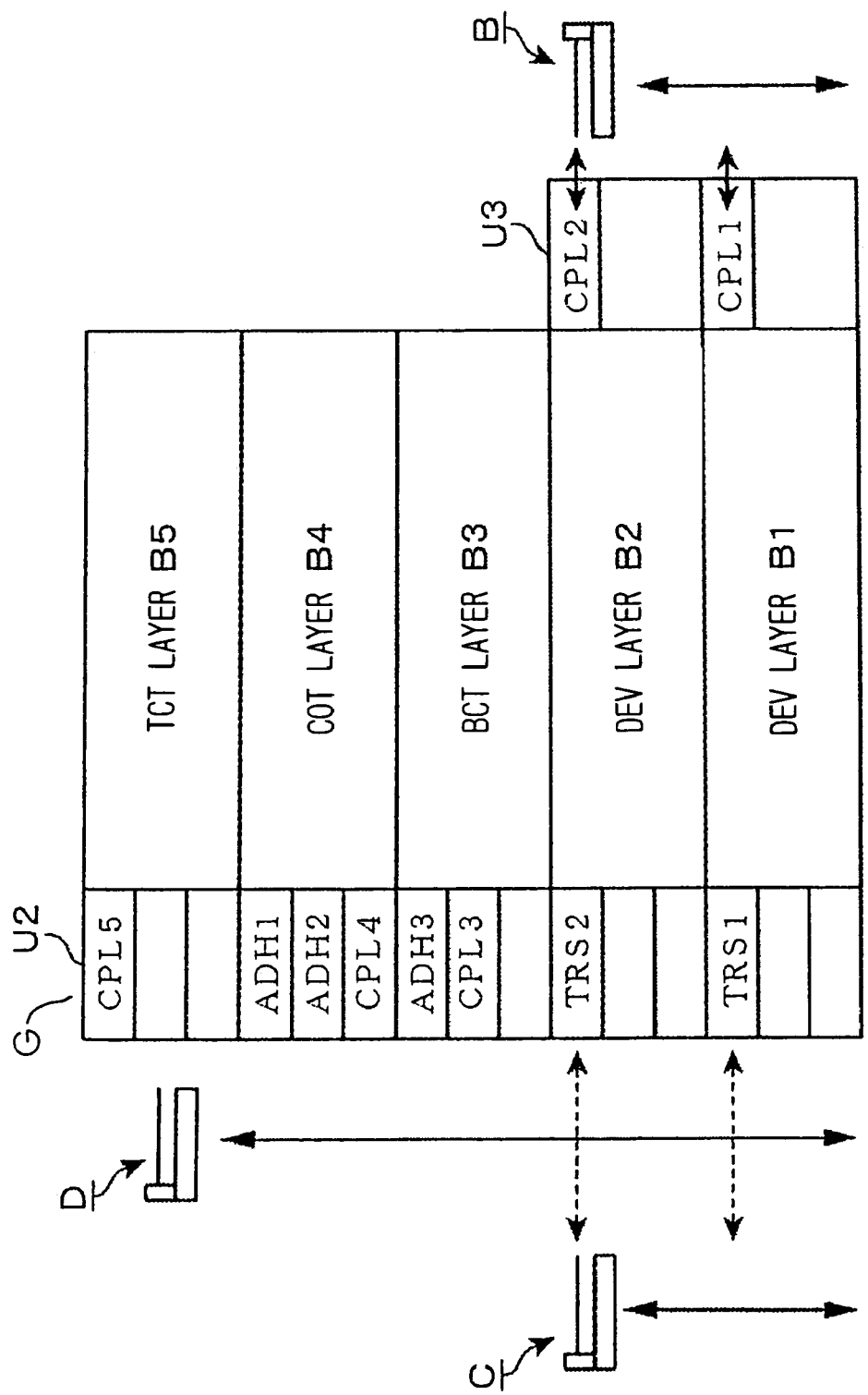
FIG. 5 is a side view showing the rack units, unit blocks and transfer arms in the coating and developing apparatus.

The rack unit U2, as shown in FIGS. 3 and 5, includes one or more transfer sections for each of the unit blocks B1 to B5 such that the transfer of each wafer W can be performed to the main arms A1 to A5 of the respective unit blocks B1 to B5. Thus, a transfer-section group G is configured in which the transfer sections are layered in multiple stages. These transfer sections are used upon transferring each wafer W between the carrier block S1 and the processing block S2 and/or between the unit blocks B1 to B5. For example, the transfer stages TRS1, TRS2 provided in the DEV layers B1, B2 and temperature control units CPL3, CPL4, CPL 5 respectively provided in the BCT layer B3, COT layer B4 and TCT layer B5 correspond to the transfer sections.

The transfer arm D is configured such that it can be optionally moved in the front and back directions as well as in the vertical direction, whereby it can transfer each wafer W to the respective transfer stages TRS1, TRS2 and/or temperature control units CPL3 to CPL 5. Also, the transfer stages TRS1, TRS2 of the DEV layers B1, B2 are respectively configured to transfer wafers W between these stages and the transfer arm C, and as such constitute together a transfer section for the carrier block.

In an area provided between the carrying area R1 and the interface block 53, as shown in FIGS. 1 and 3, the rack unit U3 is provided at a position that the main arms A1, A2 of the DEV layers B1, B2 can access, respectively. As shown in FIGS. 3 and 5, the rack unit U3 in this example includes temperature control units as transfer sections respectively adapted to transfer wafers W to the main arms A1, A2. In this example, the DEV layers B1, B2 includes one or more temperature control units CPL1, CPL2, respectively.

Next, other unit blocks B will be explained in brief. The DEV layer B2 is configured in the same manner as the DEV layer B1 and includes a developing unit 31, heating units (PEB 2, POST 2), and a cooling unit (COL 2). In the DEV layer B2, transfer of a wafer W to a transfer stage TRS2 of the rack unit U2, a temperature control unit CPL2 of the rack unit U3, the developing unit 31, and each module of the rack unit U1 can be performed, respectively, due to action of the main arm A2.

Figure 6:
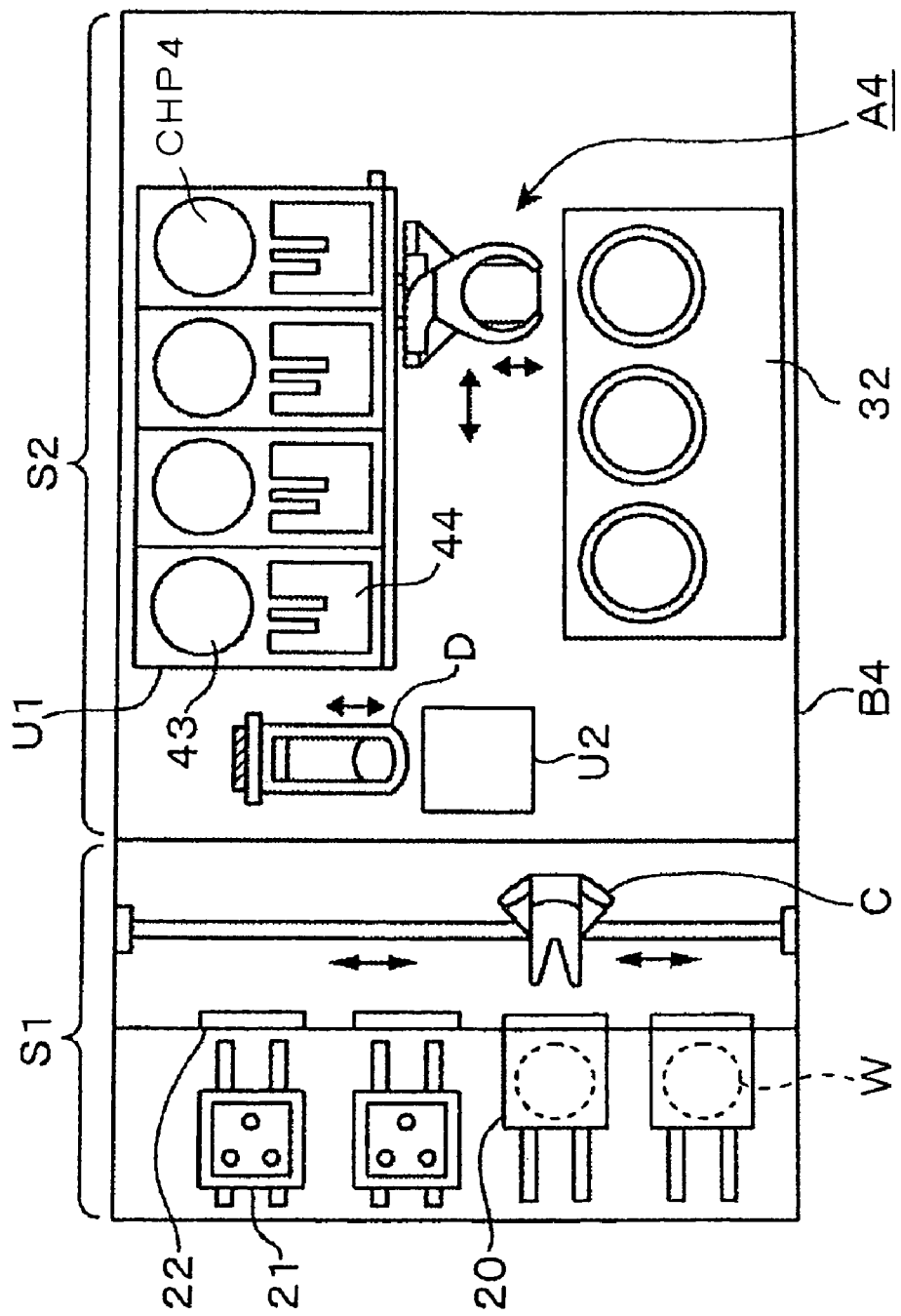
FIG. 6 is a plan view showing a unit block for performing a coating process of a resist liquid in the coating and developing apparatus.

Each of the unit blocks B3 to B5 for forming coating films is constructed in the same manner, and configured substantially similar to the aforementioned DEV layers B1, B2, except that they do not include the carrying areas adapted to connect between the carrier block S1 and the interface block S3. Specifically, the COT layer B4 will be described in brief as one example with reference to FIGS. 3, 5 and 6. In the rack unit U2, for example, two hydrophobicity rendering units ADH1, ADH2 adapted to enhance close adhesion ability between the resist liquid and each wafer W are provided as well as a temperature control unit CPL 4 adapted to serve as a transfer section is provided.

Also a coating unit 32 adapted to perform a coating process of a resist liquid on a wafer W as a liquid processing unit is provided, and a heating unit CHP4 for heating each wafer W after coated with the resist liquid and a periphery exposing apparatus are provided in a rack unit U1 of the COT layer B4. The unit blocks B3 to B5 are configured similar to the DEV layers B1, B2, except for not including the rack unit 3. The COT layer B4 is configured such that the transfer of each wafer W to the hydrophobicity rendering units ADH1, ADH2 of the rack unit U2, temperature control unit CPL4, coating unit 32 and each module of the rack unit U1 can be performed, due to action of the main arm A4.

The BCT layer B3 includes a temperature control unit CPL3 constituting a transfer section provided in the rack unit U2, and a hydrophobicity rendering unit ADH 3, and further includes a first antireflection film forming unit adapted to perform a forming process of a first antireflection film for each wafer W, as a liquid processing unit. In the rack unit U1 of the BCT layer B3, heating units are provided which are adapted to heat each wafer W after subjected to an antireflection film forming process, and the BCT layer B3 is configured similar to the COT layer B4 exception for not including a periphery exposing apparatus. The BCT layer B3 is configured such that the transfer of each wafer W to the temperature control unit CPL3 of the rack unit U2, hydrophobicity rendering unit ADH3, the first antireflection film forming unit, and each module of the rack unit U1 can be performed, due to action of the main arm A3.

The TCT layer B5 includes a temperature control unit CPL5 which is provided in the rack unit U2 and serves as a transfer section, and a second antireflection film forming unit which is provided as a liquid processing unit and adapted to perform a process of forming a second antireflection film on each wafer W. The TCT layer B5 is configured similar to the COT layer B4 except that a heating unit for heating each wafer W after subjected to an antireflection film forming process is provided in the rack unit U1 of the TCT layer B5. Also, the TCT layer B5 is configured such that the transfer of each wafer W to the temperature control unit CPL5 of the rack unit U2, the second antireflection film forming unit, and each module of the rack unit U1 can be performed, due to action of the main arm A5.

In this example, while the hydrophobicity rendering units are respectively provided in the COT layer B4 and BCT layer B3, the units may be provided in the other unit blocks B1, B2, B5, and the number of the units can be optionally selected, as long as the units are located at positions in which the transfer arm D can access the units.

It is noted that FIGS. 3 and 5 respectively show one example of a layout of modules which is provided for only the purpose of illustration, and that the modules provided in each of the unit blocks B1 to B5 are not limited to the heating units (CHP, PEB, POST), cooling units COL and/or periphery exposing apparatuses, but may include other proper modules. In practice, the number of modules to be provided is decided depending on the processing time for each module and the like.

On the front side of the rack unit 3 in the processing block S2, an exposing apparatus S4 is connected via the interface block S3. In the interface block S3, an interface arm B is provided, which is adapted to transfer each wafer W to each portion of the rack units U3 of the DEV layers B1, B2 in the processing block S2 as well as to the exposing apparatus S4. The interface arm B serves as a carrying means for each wafer W to be carried between the processing block S2 and the exposing apparatus S4. In this example, the interface arm B is configured such that it can be optionally moved in the front and back directions as well as in the vertical direction and can be rotated about the vertical axis so as to transfer each wafer W to the temperature control units CPL1, CPL2 of the DEV layers B1, B2. In this example, the temperature control units CPL1, CPL2 correspond to transfer sections for the interface, respectively.

As described above, in this embodiment, each of the unit blocks B1 to B5 is divided from each adjacent unit block in the vertical direction, the first wafer transfer area R2 for performing the transfer of each wafer W to a transfer section provided in the rack unit U2 and the area for performing the transfer of each wafer W to a transfer section provided in the rack unit U3 are connected with each other only in the DEV layers B1, B2 though the carrying area R1. In addition, among the unit blocks B1 to B5 layered in five stages, each wafer W can be transferred selectively via each transfer section of the rack unit U2 due to action of the transfer arm D, whereby each wafer W can be transferred between the carrier block S1 and the interface block 53 via the DEV layers B1, B2. In this example, the phydrophobicity rendering units ADH1, ADH2, ADH3, temperature control units CPL3, CPL4, CPL5, transfer stages TRS1, TRS2, respectively provided in the rack unit U2 described above, are included in the a transfer-section group G.

Figure 7:
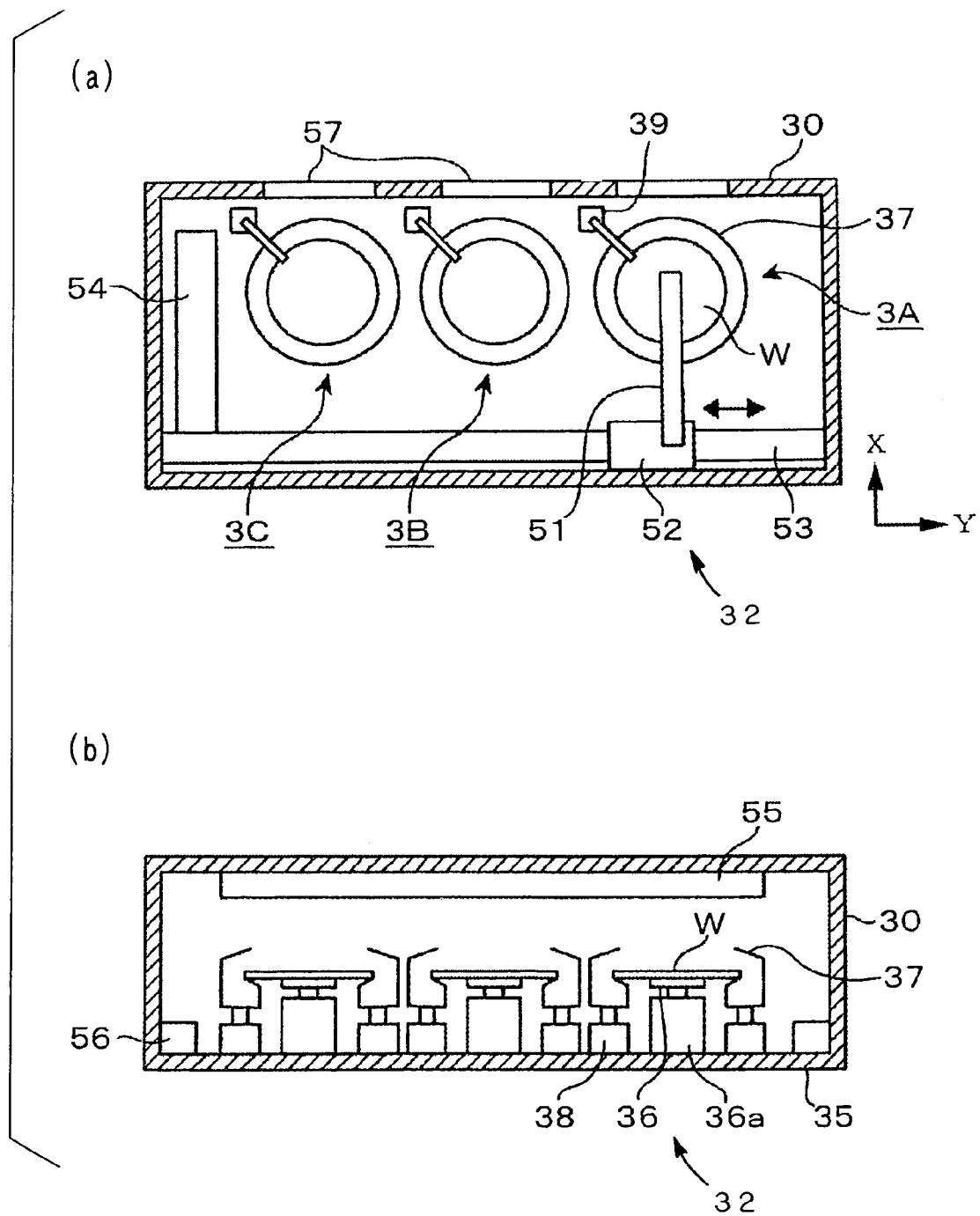
FIGS. 7(a) and 7(b) are a plan view and a vertical cross section respectively showing a coating unit in the coating and developing apparatus.

Next, the configurations of the liquid processing unit, hydrophobicity rendering unit, temperature control unit, main arms A (A1 to A5), transfer arm D, interface arm B will be described in brief. First, the liquid processing unit is briefly explained using the coating unit 32 as one example with reference to FIGS. 7(a) and 7(b). In this example, three coating sections 3A, 3B, 3C are housed in a common processing chamber 30 and provided on a common base 35, each coating section being arranged along the lateral direction (Y axis direction) to face the carrying area R1.

Since these coating sections 3A, 3B, 3C are configured similarly, only the coating section 3A is exemplarily described. In the drawings, reference numeral 36 designates each spin chuck which serves as a substrate holding portion, and is configured to hold a wafer W horizontally by a vacuum suction. The spin chuck 36 is configured such that it can be rotated about the vertical axis and also moved in the vertical direction due to a driving section 36a. Around the periphery of each spin chuck 36, a cup 37 is provided, partly covering and completely surrounding each wafer W and the side face of the spin chuck 36. At the bottom face of the cup 37 a drain section 38, for example, an exhausting pipe or drain pipe is provided. In the drawings, reference numeral 39 denotes a side rinse mechanism for supplying a rinsing liquid to a peripheral portion of each wafer W held by the spin chuck 36, which mechanism being configured such that it can be optionally moved in the vertical direction and also rotated about the vertical axis.

Reference numeral 51 designates a supply nozzle (a chemical liquid nozzle) for supplying a coating liquid to each of the three coating sections 3A, 3B, 3C. The supply nozzle 51 is configured such that it can be optionally moved horizontally and vertically, due to action of a transfer mechanism 52, along a guide rail 53 provided along the longitudinal direction (Y axis direction) of the processing chamber 30 from the outside of the cup 37 on one end side of the coating section 3A to the outside of the cup 37 on the other end side of the coating section 3C. In this way, in this example, a resist liquid is supplied to a substantially central region of a wafer W held by the spin chuck 36 of each coating section 3A to 3C. Additionally, reference numeral 54 designates a waiting area for the supply nozzle 51 provided outside the coating section 3C on the one end side, where dummy dispense or nozzle washing are provided.

Reference numeral 55 denotes a filter unit attached to the ceiling of the processing chamber 30, and reference numeral 56 is an exhausting portion provided in a bottom face of the processing chamber 30. By performing exhaustion in a predetermined exhausting amount from the exhausting portion 56 as well as by supplying temperature and humidity controlled clean air at a predetermined flow rate from the filter unit 55, down flow of the clean air is created in the processing chamber 30, thereby producing a higher pressure than the pressure around the carrying area R1 of the main arm A4. In addition, reference numerals 57 are entrances for wafers W, each being formed in the wall opposite to the carrying area R1 of the processing chamber 30 and provided with an opening and closing shutter (not shown).

In the coating unit 32, each wafer W is carried in the processing chamber 30 via each entrance 57 due to action of the main arm A4, and is then transferred to any predetermined one of the spin chucks 36 of coating sections 3A, 3B, 3C. Thereafter, a resist liquid is supplied to a central portion of the wafer W from the supply nozzle 51, and the spin chuck 36 is rotated to spread the resist liquid in the radial direction of the wafer W due to centrifugal force, thereby to form a resist liquid film on the surface of the wafer W. In this way, the wafer W having the resist liquid film formed thereon is carried out of the coating unit 32 by means of the main arm A4 via the entrance 57.

The developing unit 31 includes a developing liquid supply area formed along the longitudinal direction of the supply nozzle 51, so as to supply a developing liquid along the radial direction of the wafer W. This unit 31 is configured substantially similar to the coating unit 32 shown in FIGS. 7(a) and 7(b) except that it includes a washing liquid nozzle. The washing liquid nozzle is configured similar to the supply nozzle 51 such that it can be optionally moved along the guide rail 53 and also moved in the vertical direction, due to operation of a transfer mechanism, so as to supply a washing liquid to a wafer W held by the spin chuck 36 of each coating section (developing section) 3A to 3C.

In this developing unit 31, a developing liquid is supplied to a central portion of each wafer W from the supply nozzle 51, and the wafer is then turned, for example, by half a rotation due to the spin chuck 36, thereby to supply the developing liquid over the whole surface of the wafer W. After a predetermined period of time, a washing liquid is supplied to the wafer W from the washing liquid nozzle to wash away the developing liquid from the surface of the wafer W, followed by rotating the wafer W to dry it up, thus completing the developing process.

Rather than providing the washing nozzles separately in the developing unit 31, a washing mechanism may be provided in the same manner as the side rinse mechanism 39 of the coating unit 32, such that it can be optionally moved in the vertical direction as well as rotated about the vertical axis, so as to supply the washing liquid to a central portion of each wafer W held by the spin chuck 36.

The first antireflection film forming unit serves to coat a chemical liquid for forming an antireflection film on each wafer W prior to coating the resist liquid, while the second antireflection film forming unit serves to coat a chemical liquid for forming an antireflection film on the wafer W after the resist liquid has been coated thereon. These units are configured similar to the coating unit 32, respectively, except that each of them supplies a chemical liquid for forming an antireflection film from the supply nozzle 51.

Figure 8:
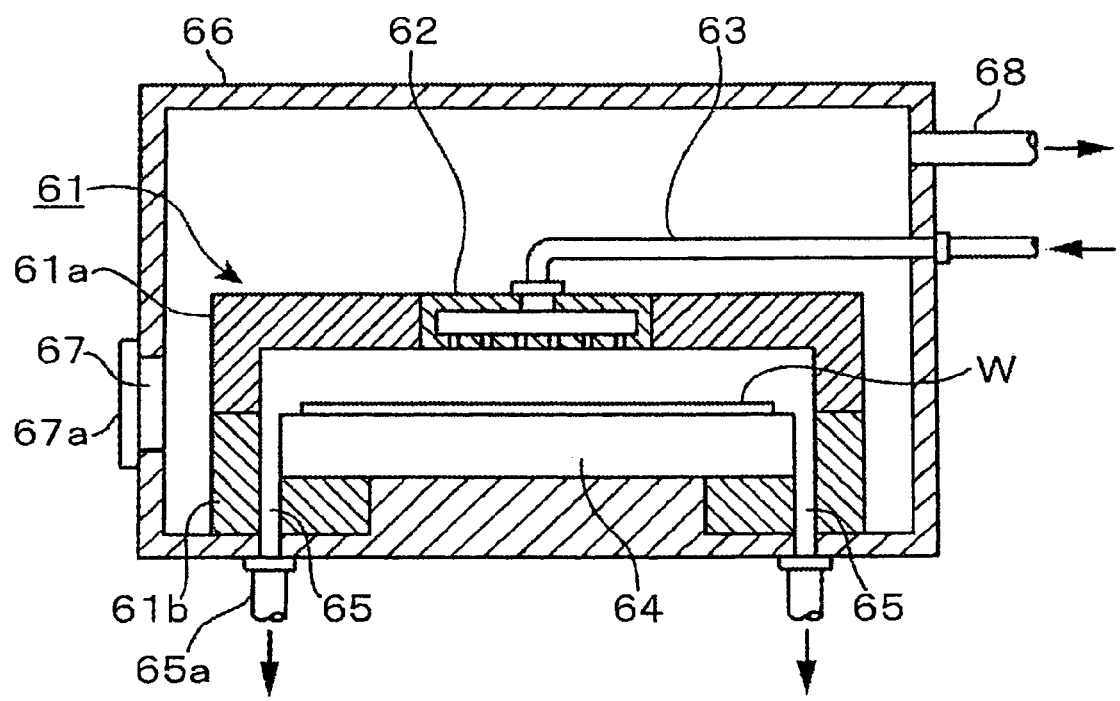
FIG. 8 is a vertical cross section showing a hydrophobicity rendering unit in the coating and developing apparatus.

Next, the hydrophobicity rendering unit will be described with reference to FIG. 8. In the drawing, reference numeral 61 designates a hermetically sealed chamber comprising a cover 61a and a lower container 61b, and a gas supply portion 62 is provided to the cover 61a. The gas supply portion 62 is connected with a gas supply source (not shown) via a gas supply pipe 63. In the lower container 61b, a wafer placing table 64 is provided, around which exhausting passages 65 are formed, wherein an exhausting pipe 65a is connected with each exhausting passage 65. The hermetically sealed chamber 61 is covered with a cover 66. A wafer entrance 67 which can be opened and closed due to a shutter 67a is formed in the cover 66. Additionally, an exhausting pipe 68 is connected to the cover 66. The transfer of the wafer W onto the wafer placing table 64 is carried out by support pins (not shown) which is configured to optionally move in the vertical direction.

In the hydrophobicity rendering unit, the cover 61a is lifted up, and a wafer W is placed on the placing table 64 via the entrance 67 due to operation of the support pins. The cover 61a is closed while the shutter 67a is closed, and a hydrophobicity rendering gas, for example, an HMDS gas (hexamethyldisilazane gas) is supplied from the gas supply portion 62 onto the surface of the wafer W, thereby rendering the surface hydrophobic. Since the HMDS gas contains amine groups, the cover 61a is opened after the hermetically sealed chamber 61 is well exhausted so as not to leak the gas outside, and the gas in the volume surrounded by the cover 66 is also exhausted.

In this example, while the hydrophobicity rendering process is performed at a normal temperature, it may be performed with the temperature of the placing table 64 being controlled, for example, by circulating water constantly controlled at about 50° C. though the placing table 64. In such a way, by performing the hydrophobicity rendering process with the temperature of the placing table 64 being set lower than 50° C., heat accumulation in the carrying means, for example, the transfer arm D or the main arm A4 of COT layer B4, for transferring the wafer W to the hydrophobicity rendering unit can be controlled. Additionally, upon performing a next process, it can be achieved to reduce the time required for temperature control of the wafer W in a module which controls the temperature of the wafer W to a temperature for performing the resist liquid coating process.

Figure 9:
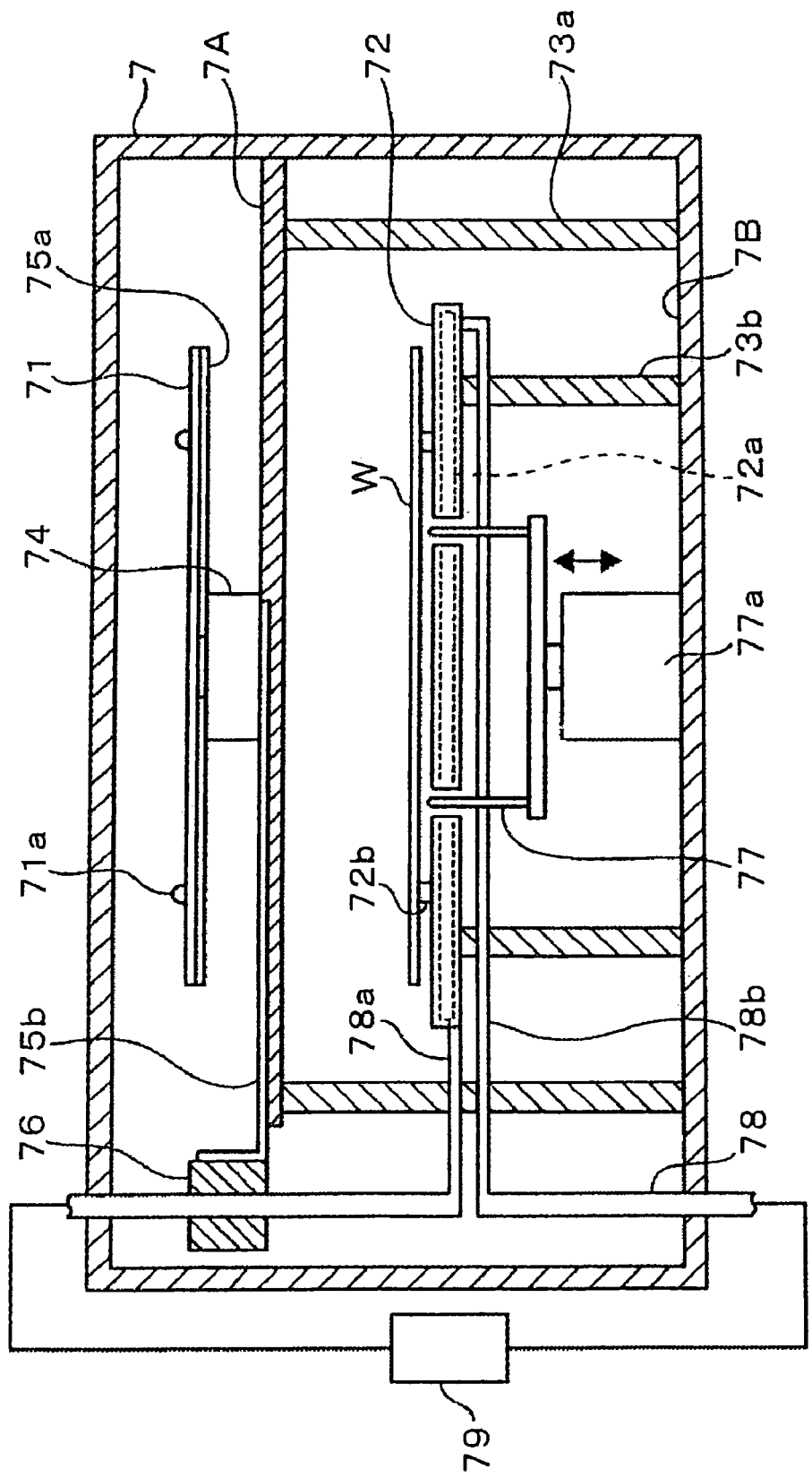
FIG. 9 is a vertical cross section showing a temperature control unit in the coating and developing apparatus.

Next, the temperature control unit will be described. The temperature control unit is adapted to control the temperature of a wafer W when it is placed on the table prior to forming a coating film and a chemical liquid for forming the coating film is coated on the wafer W. For example, as shown in FIG. 9, the temperature control unit comprises a first temperature control plate 71 on which a wafer W heated in a heating unit is placed and which controls roughly the temperature of the wafer W to a first temperature, and a second temperature control plate 72 on which the wafer W is placed and which controls more precisely the temperature of the wafer W to a temperature for performing the process of coating a chemical liquid for forming a coating film on the wafer W. These plates are provided in a layered fashion in a common processing chamber 7. As the process for coating a chemical liquid for forming a coating film, a process for coating the resist liquid on a wafer W, a process for forming the first antireflection film on the wafer W, and a process for forming the second antireflection film on the wafer W can be used.

The space in the processing chamber 7 is divided vertically by a base plate 7A which is supported by first support members 73a extending vertically from a bottom wall 7B of the processing chamber 7. On the base plate 7A, the first temperature control plate 71 is provided, with its back side central portion being supported by, for example, a cylindrical placing portion 74 formed of copper or aluminum.

Figure 10:
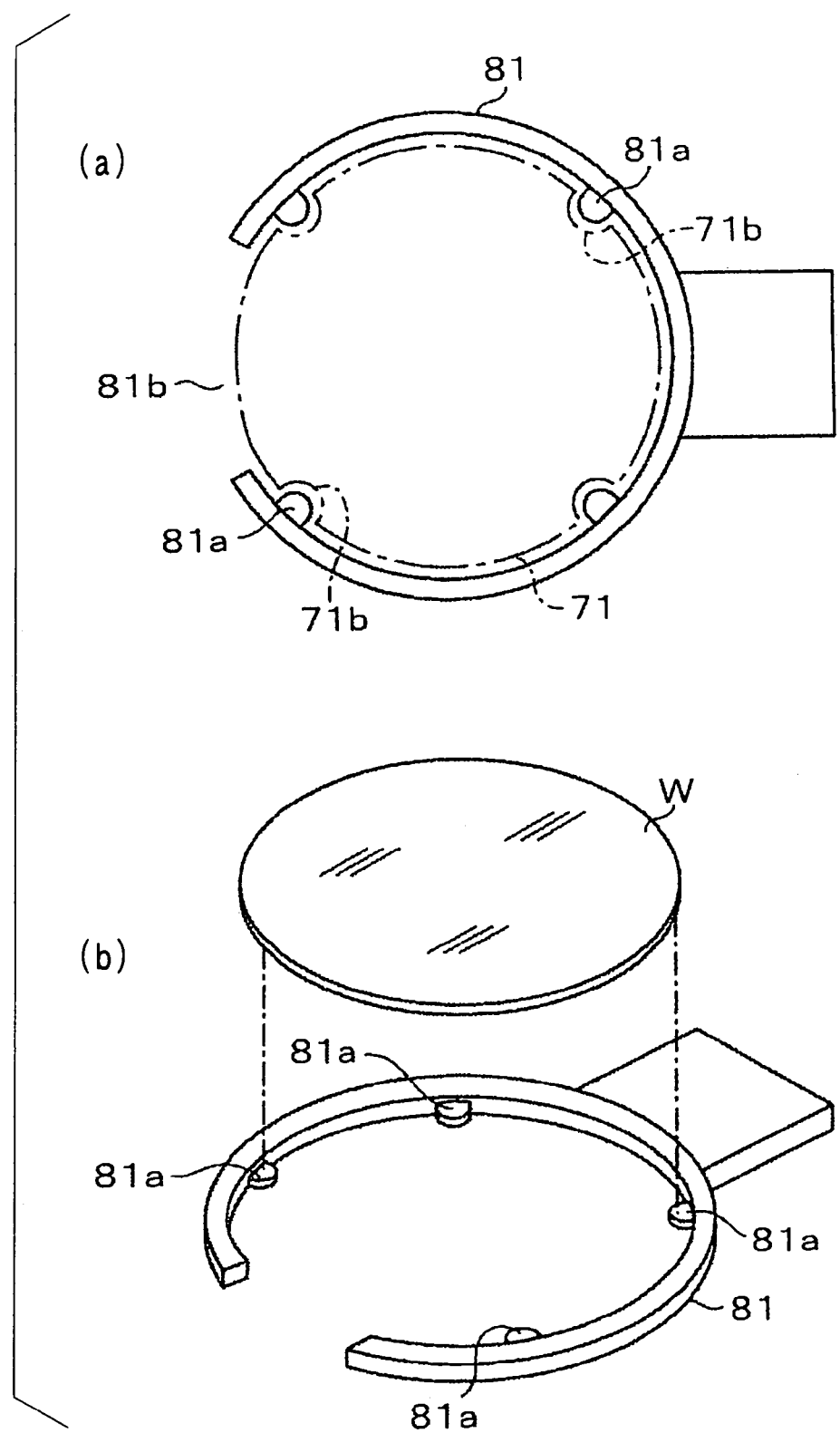
FIGS. 10(a) and 10(b) are a plan view and a perspective view respectively showing a carrying means in the coating and developing apparatus.

In this example, the first temperature control plate 71 is formed, with aluminum for example, into a generally disk-like plate, and has a diameter substantially the same as that of wafer W. In the drawing, reference numeral 71a designates projections adapted to support a wafer W while lifting up it approximately 0.1 mm to 0.3 mm from the temperature control plate 71. Additionally, at four points, for example, of the periphery of the temperature control unit 71, as shown in FIG. 10, notched portions 71b are formed extending toward the center of the temperature control plate 71.

Around the whole back side of the temperature control plate 71, a first heating pipe 75a is provided, which is embedded, for example, in a groove (not shown) formed in the back side of the temperature control plate 71. A part of the heating pipe 75a is connected with the placing portion 74. In the base plate 7A, a second heating pipe 75b is embedded such that it contacts with the bottom face of the placing portion 74. The second heating pipe 75b is embedded such that it extends along the base plate 7A toward one end of the base plate 7A. The other end of the second heating pipe 75b is bended to extend upward from the base plate 7A, and a part of the other end is connected with a surface of a heat transfer member 76 formed of copper or aluminum, for example.

The heating pipes 75a, 75b are adapted to perform heat transport utilizing absorption and radiation of latent heat due to vaporization or condensation, each of which is constructed by attaching a porous material to an inner surface of a metallic tubular body comprising, for example, aluminum or stainless steel. The porous body serves to provide capillarity as described below, and is composed of a wire netting or metal felt formed by knitting a fine metallic wire. Both sides of the tubular body are closed so that its interior can be brought into a vacuum state by exhaustion. In the interior of the tubular body, volatile liquid (actuator fluid) comprising sodium or naphthalene is enclosed in a small amount.

In such a heating pipe, when its one end (a vaporizing portion) is heated, the actuator fluid is vaporized (by absorption of heat due to latent heat for vaporization) and changed into a flow of steam, thus moving through the tubular body due to a slight pressure difference at a high speed toward a condensing portion (a lower temperature portion) on the other end side where the flow of steam is cooled and condensed by the wall surface of the tubular body. At this time, since heat is radiated by heat of condensation, the heat is transferred to the condensing portion. Then, the liquid created by the condensation is returned to the vaporizing portion due to capillarity through the porous material, and the cycle consisting of such vaporization, transfer and condensation is repeated again, thereby transporting heat continuously. Therefore, cooling the other end side of the heating pipe causes the whole surface of this heating pipe to be cooled uniformly. As used herein, the heating pipe is not limited to a pipe as considered by a general concept and may be constructed with flat plates to have a wide cavity in which the actuator fluid is enclosed.

The second temperature control plate 72 is formed of, for example, aluminum. For example, it is formed into a generally disk-like plate having a thickness of about 4 mm, and has a diameter larger than a wafer W. In the interior of the plate 72, for example, a temperature control fluid passage 72a is provided to direct a temperature control fluid therethrough, with the liquid being adjusted at a predetermined temperature. The second temperature control plate 72 is supported by second support members 73b extending vertically from a bottom wall 7B of the processing chamber 7 and positioned inside the first support members 73a. On the surface of the second temperature control plate 72, projections 72b are provided for supporting each wafer W while lifting up it approximately 0.1 mm to 0.3 mm from the temperature control plate 72. Additionally, support pins 77 are provided for transferring each wafer W to the external carrying mechanisms such that their distal portions can be optionally projected and retracted from the surface of the cooling plate 72. Furthermore, on the inside of the first support members 73a, a lifting mechanism 77a for the support pins 77 is provided.

In the drawing, reference numeral 78 is a temperature control fluid circulation passage for circulating a temperature control fluid adjusted at a predetermined temperature, and is composed of a fluid flowing pipe formed of a material, for example, aluminum or the like having a proper heat conductivity, and is provided such that it extends vertically through the processing chamber 7. The temperature control fluid circulation passage 78 is also provided to extend through a substantially central portion of the heat transfer member 76. In addition, the temperature control fluid circulation passage 78 is configured to supply the temperature control fluid to the temperature control fluid passage 72a of the second temperature control plate 72 via a temperature control fluid supply passage 78a. The temperature control fluid is discharged from the temperature control fluid passage 72a of the second temperature control plate 72 via the temperature control fluid discharge passage 78b, and then returned to the temperature control fluid circulation passage 78. In the drawing, reference numeral 79 designates a temperature control mechanism for controlling a liquid temperature, which is provided outside the processing chamber 7.

In this way, when the temperature control fluid adjusted at a predetermined temperature, for example, 23° C. is circulated into the temperature control fluid circulation passage 78, since the first heating pipe 75a is indirectly contacted with the outer surface of the temperature control fluid circulation passage 78 via the placing portion 74, second heating pipe 75b and heat transfer member 76, the heat of the outer surface of the temperature control fluid circulation passage 78 is transferred along a route from the heat transfer member 76, through the second heating pipe 75b and placing portion 74, to the first heating pipe 75a, thus the first heating pipe 75a is adjusted at the temperature of the outer surface of the temperature control fluid circulation passage 78. As a result, the surface of the first temperature control plate 71 is adjusted at 23° C. Since the temperature control fluid is supplied by circulation to the temperature control fluid passage 72a of the second temperature control plate 72, the surface temperature of the second temperature control plate 72 is always and accurately adjusted at 23° C.

It will be appreciated that in the temperature control unit describe above, two or more first temperature control plates 71 may be provided in a layered fashion. The first temperature control plate 71 is configured such that a wafer W is transferred onto the temperature control plate 71 when an external carrying mechanism passes through the temperature control plate 71 from above to below. Thus, since a lifting mechanism is not required unlike the case where a wafer W is transferred by lifting and lowering support pins, the vertical dimension of a space in which the temperature control plate 71 is provided can be reduced, and even such a lower-height space can be readily accommodated to a layered structure.

It will also be appreciated that in the temperature control unit described above, two or more second temperature control plates 72 may be provided in a layered fashion. In such a case, the temperature control fluid can be supplied from a common temperature control fluid circulation passage 78 through a temperature control fluid passage 78a provided for each temperature control plate 72 to each corresponding temperature control fluid passage 72a of temperature control plate 72. Thereafter, the temperature control fluid is discharged from each corresponding temperature control passage 72a of temperature control plate 72 through a temperature control fluid discharge passage 78b provided for each temperature control plate 72, and thereafter it is returned to the common temperature control fluid circulation passage 78.

Next, the carrying mechanism will be explained. First, each of the main arms A, for example, as shown in FIG. 4, includes two carrying arms 81, 82 for respectively supporting a peripheral region on the back side of each wafer W. These carrying arms 81, 82 are configured to be optionally moved front and back independently of each other along a base 83. The base 83 is configured such that it can be optionally rotated about the vertical axis due to a rotating mechanism 84 as well as it can be moved in the Y axis direction along a Y axis rail 87 attached to a face opposite to the carrying area R1 of a base 86 for supporting the rack unit U1 and can also moved in the vertical direction along a lifting rail 88 due to action of a transfer mechanism 85. In this way, each of the carrying arms 81, 82 is configured such that it can be optionally moved in the front and back directions as well as in the Y axis direction and can be moved in the vertical direction and also rotated about the vertical axis, whereby it can receive and transfer each wafer W from and to each module of the rack unit U1, liquid processing units, transfer sections and hydrophobicity rendering units of the rack unit U2 and transfer sections of the rack unit U3 in the DEV layers B1, B2. Each of the main arms A is controlled by a controller (not shown) based on an instruction from a control section 100 described below. In order to prevent accumulation of heat in heating units for these arms, the order of transferring wafers W can be selectively controlled by employing a proper program.

Now, the shape of each arm 81, 82 will be described, utilizing the carrying arm 81 as an example, with reference to FIGS. 10(a) and 10(b). The arm 81 is of a horizontal horse's hoof-like shape such that it enables transfer of a wafer W to each temperature control unit. The size of the inner periphery of the carrying arm 81 is designed to be slightly larger than the diameter of the first temperature control plate 71. At a lower portion of the inner periphery, four projections 81a are provided such that a wafer W can be held on these projections 81a as shown in the drawing.

As described above, since the carrying arm 81 is configured such that it can be optionally moved in the vertical direction as well as in the front and back directions, upon transferring a wafer W onto the first temperature control plate 71, the carrying arm 81 holding a wafer W thereon enters the processing chamber 7 through an entrance (not shown) thereof. In this case, the notched portions 71b in the outer periphery of the temperature control plate 71 are respectively provided at positions each corresponding to each projection 81a of the carrying arm 81. Thus, when the carrying arm 81 is lowered as it covers the temperature control plate 71 from above, a wafer W on the carrying arm 81 is transferred onto the temperature control plate 71 while the carrying arm 81 passes downward through the temperature control plate 71. After the transfer of the wafer W, the carrying arm 81 is withdrawn from the interior of the processing chamber 7 toward the front side with its front notched portion 81b passing through the outside of the placing portion 74. Accordingly, the diameter of the placing portion 74 is designed to be smaller than the notched portion 81b formed in the carrying arm 81.

In the case of the second temperature control plate 72, the support pins 77 are projected upward from the second temperature control plate 72, and the carrying arm 81 is lowered as it covers the second temperature control plate 72 from above, thus a wafer W on the carrying arm 81 can be transferred onto the support pins 77. After transferring the wafer W, the carrying arm 81 is withdrawn from the interior of the processing chamber 7 toward the front side with its front notched portion 81b passing through the outside of the support pins 77. Thereafter, the support pins 77 are lowered, as such the wafer W is transferred from the support pins to the second temperature control plate 72. Accordingly, the positions of the support pins 77 are set such that the notched portion 81b formed in the carrying arm 81 can pass through the outside of the support pins 77.

The interface arm B is adapted to transfer a wafer W between the temperature control units CPL1 and CPL2 provided in the rack unit 3, thus the arm member having a shape as shown in FIG. 10 is configured such that it can be optionally moved in the front and back directions as well as in the vertical direction and can also be rotated about the vertical axis, whereby it can transfer each wafer W between the temperature control units CPL1, CP22 of the rack unit U3 and the exposing apparatus S4.

The transfer arm D is also adapted to transfer a wafer W between the temperature control units CPL3 to CPL5 provided in the rack unit U2, thus the arm member having a shape as shown in FIG. 10 is configured such that it can be optionally moved in the front and back directions as well as in the vertical direction, whereby it can transfer each wafer W to the respective sections of the rack unit U2. The driving of such a transfer arm D and interface arm B is controlled by a controller (not shown) based on an instruction from the control section 100 described below.

As the heating units (CHP, POST, PEB), heating plates 43, and cooling plates 44 each also serving as a carrying arm, are provided as shown in FIG. 1, such that each wafer W between each of the main arms A and each heating plate 43 can be transferred by each corresponding cooling plate 44. Namely, an apparatus in which a heating process and a cooling process are performed in each single unit is employed. As the cooling units COL1, COL2, for example, apparatuses each having a cooling plate of the water-cooling type are used.

The coating and developing apparatus includes the control section 100 comprising a computer which is adapted to control recipes of the respective processing units, recipes of carrying flows (carrying routes) of wafers W, processes in the respective processing units, and driving of the main arms A1 to A5, transfer arm C, transfer arm D and interface arm B. Namely, in the control section 100, a control is carried out for carrying and processing each substrate in a predetermined order in each predetermined module in the unit blocks B1 to B5 depending on a coating film to be formed. Each of the recipes of carrying flows (carrying recipes) designates each carrying route (the order of carrying) of wafers W in each unit block, which is created depending on the type of a coating film to be formed, thus a plurality of carrying recipes are stored in the control section 100.

For example, as one aspect to form a coating film on a wafer W, there is a case where each wafer W is carried through all the unit blocks B1 to B5 so as to form coating films including the first antireflection film, resist film and second antireflection film, a case where each wafer W is carried into the COT layer B4 and DEV layers B1, B2 so as to form a coating film including only the resist film, a case where each wafer W is carried into the COT layer B4, BCT layer B3 and DEV layers B1, B2 so as to form coating films including the first antireflection film and resist film, a case where each wafer W is carried into the COT layer B4, TCT layer B5 and DEV layers B1, B2 so as to form coating films including the resist film and second antireflection film, or a case where each wafer W is carried into only the DEV layers B1, B2. In addition, in the respective coating films, since there are a case where the hydrophobicity rendering process is performed and another case where this process is not performed, upon forming the resist film and/or first antireflection film, different recipes are further created depending on the case.

Accordingly, upon performing some processes, proper carrying recipes are selected depending on the type of a coating film to be formed by a recipe selection means of the control section 100, so that the unit blocks, modules to be used and order of carrying each wafer W to the modules can be selected, whereby driving of the respective modules and arms in each predetermined unit block can be controlled, thereby to perform a series of processes.

Subsequently, in the case where a coating film comprising the resist film and second antireflection film is formed on each wafer W by using the resist pattern forming apparatus described above, the flow of each wafer W when the carrying recipe that performs the hydrophobicity rendering process prior to coating a resist liquid will be described. In this recipe, each wafer W is carried into the COT layer B4, TCT layer B5 and DEV layers B1, B2.

First, a carrier 20 is carried from the outside into the carrier block S1, and a wafer W is then taken out from the carrier 20 by the transfer arm C. Thereafter, the wafer W is carried along a route from the transfer arm C, through the transfer stage TRS 1 (TRS2) of the rack unit U2 in the DEV layer B1 (DEV layer B2) and transfer arm D, to the hydrophobicity rendering process unit ADH1 (ADH2), where a hydrophobicity rendering process is performed.

Next, the wafer W is carried along a route from the transfer arm D, through the second temperature control plate 72 of the temperature control unit CLP4, main arm A4 of the COT layer B4, coating unit 32, main arm A4, heating unit CHP4 and main arm A4, to the first temperature control plate 71 of the temperature control unit CPL4 of the rack unit U2, thus a resist film is formed.

Before carried in the coating unit 32, the temperature of the wafer W is adjusted at $(23+0.2)°$ C. by the second temperature control plate 72 of the temperature control unit CPL4. Thereafter, the wafer W will be carried into the first temperature control plate 71 of the temperature control CPL4 after being processed in the heating unit CHP4. In the heating unit CHP4, while the wafer W is heated by the heating plate 43 as described above, it is then cooled to about 50° C. by the cooling plate 44 to roughly remove heat just after the heating process. Therefore, by placing the wafer W on the first temperature control plate 71 of the temperature control unit CPL4 for approximately 12 seconds, the wafer W is cooled from 50° C. to $(23+1)°$ C.

Subsequently, the wafer is carried along a route defined in the order from the transfer arm D, through the second temperature control plate 72 of the temperature control unit CPL5, main arm A5, second antireflection film unit, heating unit and periphery exposing apparatus, to the first temperature control plate 71 of the temperature control unit CPL5 of the rack unit U2, thus the second antireflection film is formed on the resist film. Again, before carried in the second antireflection film unit, the temperature of the wafer W is adjusted at $(23+0.2)°$ C. by the second temperature control plate 72 of the temperature control unit CPL5. Thereafter, the wafer W is cooled to about 50° C. by the cooling plate 44 in the heating unit to roughly remove heat just after the heating process, and is then carried onto the first temperature control plate 71 of the temperature control unit CPL5 via the periphery exposing apparatus, as such cooled to $(23+1)°$ C.

Then, the wafer is carried along a route from the transfer arm D, through the transfer stage TRS1 (TRS2), main arm A1 (A2), second temperature control plate 72 of the temperature control unit CPL1 (CPL2) of the rack unit U3 and interface arm B, to the exposing apparatus S4, where a predetermined exposing process is carried out. Before being transferred to the interface arm B, the wafer W is cooled from $(23+1)°$ C. to $(23+0.2)°$ C. by the second temperature control plate 72 of the temperature control unit CPL1 (CPL2).

After the exposing process, the wafer W is carried along a route from the interface arm B, through the first temperature control plate 71 of the temperature control unit CPL1 (CPL2) of the rack unit U3, main arm A1 (A2) of the DEV layer B1 (DEV layer B2), heating unit (PEB1 (PEB2)), cooling unit (COL1 (COL2)) and developing unit 31, to the heating unit (POST1 (POST2)), thus a predetermined developing process is performed. In this way, the wafer W having been subjected to the developing process is returned to the original carrier 20 placed on the carrier block S1, due to action of the transfer arm C, through the transfer stage TRS1 (TRS2) of the rack unit U2. In this case, the wafer W from the interface arm B is cooled to $(23+1)°$ C. by the first temperature control plate 71 of the temperature control unit CPL1 (CPL2) of the rack unit U2, and is then carried into the heating unit (PEB1 (PEB2)).

Next, in the case where a coating film comprising the first antireflection film, resist film and second antireflection film is formed by using the resist pattern forming apparatus described above, the flow of each wafer W in the carrying recipe that does not include the hydrophobicity rendering process prior to coating a resist liquid will be described. In this recipe, each wafer W is carried into the BCT layer B3, COT layer B4, TCT layer B5 and DEV layers B1, B2.

In this case, each wafer W in a carrier 20 carried into the carrier block S1 is carried along a route defined in this order from the transfer arm C, through the transfer stage TRS1 (TRS2) of the rack unit U2 in the DEV layer B1 (DEV layer B2), transfer arm D, second temperature control plate 72 (for adjusting the temperature of the wafer W at $(23+0.2)°$ C.) of the temperature control unit CPL3 of the rack unit U2, main arm A3 of the BCT layer B3, first antireflection film unit 33, main arm A3, heating unit CHP3 and main arm A3, to the first temperature control plate 71 of the temperature control unit CPL3 of the rack unit U2, and as such the wafer W is cooled to $(23+1)°$ C. as previously described.

Then, the wafer W having the fist antireflection film formed thereon is carried along a route from the transfer arm D, through the second temperature control plate 72 (for adjusting the temperature of the wafer W at $(23+0.2)°$ C.) of the temperature control unit CPL4 of the rack unit U2, main arm A4, coating unit 32 and heating unit CHP4, to the first temperature control plate 71 of the temperature control unit CPL4 of the rack unit U2, and thus the wafer W is cooled from 50° C. to $(23+1)°$ C. as described above.

Thereafter, the wafer W having the resist film formed on the first antireflection film thereof is carried along a route defined in the order from the transfer arm D, through the second temperature control plate 72 (for controlling the temperature of the wafer W from $(23+1)°$ C. to $(23+0.2)°$ C.) of the temperature control unit CPL5, main arm A5, second antireflection film unit, heating unit and periphery exposing apparatus, to the first temperature control plate 71 of the temperature control unit CPL5 of the rack unit U2, and thus the wafer is cooled to $(23+1)°$ C. as previously described. In this way, the wafer having the first antireflection film, resist film and second antireflection film formed thereon in this order from below is then carried into the exposing apparatus S4 via the DEV layer B1 (B2) and interface block S3, and thereafter the wafer W having been subjected to the exposing process is further subjected to a predetermined developing process in the DEV layers B1, B2.

Furthermore, in the case where a coating film comprising the first antireflection film and resist film is formed by using the resist pattern forming apparatus described above, the flow of each wafer W when the carrying recipe that does not perform the hydrophobicity rendering process prior to coating a resist liquid will be described. In this recipe, each wafer W is carried into the BCT layer B3, COT layer B4 and DEV layers B1, B2.

In this case, each wafer W in a carrier 20 carried into the carrier block S1 is carried along a route defined in the order from the transfer arm C, through the transfer stage TRS1 (TRS2) of the rack unit U2 in the DEV layer B1 (DEV layer B2), transfer arm D, second temperature control plate 72 (for adjusting the temperature of the wafer W at $(23+0.2)°$ C.) of the temperature control unit CPL3 of the rack unit U2, main arm A3 of the BCT layer B3, first antireflection film unit 33, main arm A3, heating unit CHP3 and main arm A3, to the first temperature control plate 71 of the temperature control unit CPL3 of the rack unit U2, and as such the wafer W is cooled from 50° C. to (23+1)° C. as previously described.

Then, the wafer W having the fist antireflection film formed thereon is carried along a route from the transfer arm D, through the second temperature control plate 72 (for adjusting the temperature of the wafer W at (23+0.2)° C.) of the temperature control unit CPL4 of the rack unit U2, main arm A4, coating unit 31, heating unit CHP4 and periphery exposing apparatus, to the first temperature control plate 71 of the temperature control unit CPL4 of the rack unit U2, and thus the wafer W is cooled from 50° C. to (23+1)° C. as described above.

Subsequently, the wafer W having the resist film formed on the first antireflection film thereof is carried into the exposing apparatus S4 via the DEV layer B1 (B2) and interface block S3 as described above, and thereafter the wafer W having been subjected to the exposing process is further subjected to a predetermined developing process in the DEV layers B1, B2.

Next, in the case where a coating film comprising only the resist film is formed by using the resist pattern forming apparatus described above, the flow of each wafer W when the carrying recipe that performs the hydrophobicity rendering process prior to coating a resist liquid will be described. In this recipe, each wafer W is carried into the COT layer B4 and DEV layers B1, B2.

In this case, each wafer W in a carrier 20 carried into the carrier block S1 is carried along a route defined in the order from the transfer arm C, through the transfer stage TRS1 (TRS2) of the rack unit U2 in the DEV layer B1 (DEV layer B2), transfer arm D, second temperature control plate 72 (for adjusting the temperature of the wafer W at (23+0.2)° C.) of the temperature control unit CPL3 of the rack unit U2, main arm A4, coating unit 32, heating unit CHP4 and periphery exposing apparatus, to the first temperature control plate 71 of the temperature control unit CPL4 of the rack unit U2, and as such the wafer W is cooled from 50° C. to (23+1)° C. as previously described.

Subsequently, the wafer W having the resist film formed on the first antireflection film thereof is carried into the exposing apparatus S4 via the DEV layer B1 (B2) and interface block S3 as described above, and thereafter the wafer W having been subjected to the exposing process is further subjected to a predetermined developing process in the DEV layers B1, B2.

It should be noted that the hydrophobicity rendering process is not necessarily performed even in the case of forming a coating film including the resist film and second antireflection film or in the case of forming a coating film including only the resist film. In such a case, each wafer W is carried into the COT layer B4 along a route from the transfer stage TRS1 (TRS2) of the rack unit U2, through the transfer arm D and second temperature control plate 72 of the temperature control unit CPL4, to the main arm A4 of the COT layer B4, as such the wafer W is subjected to a predetermined process.

Alternatively, the hydrophobicity rendering process may be performed even in the case of forming a coating film including the first antireflection film and resist film or in the case of forming a coating film including the first antireflection film, resist film and second antireflection film. In this case, each wafer W is carried into the COT layer B4 along a route of the first temperature control plate 71 of the temperature control unit CPL3 of the rack unit U2 in the BCT layer B3, transfer arm D, hydrophobicity rendering unit ADH1 (ADH2) and second temperature control plate 72 of the temperature control unit CPL4, to the main arm A4 of the COT layer B4, as such the wafer W is subjected to a predetermined process.

In the resist pattern forming apparatus described above, the hydrophobicity rendering unit is provided in the rack unit U2 and the transfer of each wafer W to the hydrophobicity rendering unit is carried out by the transfer arm D. Therefore, in the case of performing a hydrophobicity rendering process to the wafer W, there is no need to use the main arm A4 of the COT layer B4 for the transfer of the wafer W to the hydrophobicity rendering unit. As such, the load to be imposed on the main arm A4 can be reduced, leading to higher carrying efficiency, thereby to achieving higher throughput for that enhancement.

In the COT layer B4, since the transfer of the wafer W to the hydrophobicity rendering unit due to the main arm is not required as described above, the carrying route for the wafer W in the unit block B4 can be facilitated. Furthermore, by providing the hydrophobicity rendering unit in the rack unit U2 on the side of carrier block S1 corresponding to the COT layer B4, each wafer W can be carried into the COT layer B4 after it has been subjected to a hydrophobicity rendering process on the route of carrying it from the carrier block S1 or BCT layer B3 to the COT layer B4. Thus, the carrying route of the wafer W can be further facilitated. Since the facilitation of the carrying route can be achieved as describe above, complicatedness of the carrying program can be controlled even in the case of forming different coating films in a single coating and developing apparatus, as well as the software employed can be facilitated.

For example, in the case of performing the hydrophobicity rendering process in the COT layer B4, each wafer is carried along a route from the hydrophobicity rendering unit ADH1 (ADH2), through the temperature control unit CPL4, coating unit 32 and heating unit CHP4, to the temperature control unit CPL4. Alternatively, in the case of not performing the hydrophobicity rendering process, each wafer W is carried along a route from the temperature control unit CPL4, through the coating unit 32 and heating unit CHP4, to the temperature control unit CPL4. Namely, by providing the hydrophobicity rendering unit in the rack unit U2, the carrying route of the wafer W is the same in the unit block B4, both in the cases of performing and not performing the hydrophobicity rendering process. Thus, even in the case of performing the hydrophobicity rendering process, the carrying program can be facilitated while corresponding to the case of not performing the hydrophobicity rendering process.

Furthermore, in the case of providing the hydrophobicity rendering unit and the temperature control unit in the same rack unit U2, upon controlling the temperature of each wafer W in the temperature control unit between the hydrophobicity rendering process and the resist coating process, the transfer of wafer W between the hydrophobicity rendering unit and the temperature control unit is performed by the transfer arm D. In this case, the main arm A4 of the COT layer B4 is not needed for carrying the wafer W, the load on the main arm A4 can be reduced, thereby enhancing the throughput.

Additionally, during the transfer of each wafer W between the carrier block S1 or BCT layer B3 and the COT layer B4, both the hydrophobicity rendering process and temperature controlling process can be performed. Therefore, the hydrophobicity rendering process as well as the temperature controlling process can be performed in a route for each wafer W to be carried between the carrier block S1 and the COT layer B4 or between the BCT layer B3 and the COT layer B4, thus facilitating the carrying route of the wafer W. In such a case, by providing the hydrophobicity rendering unit and the temperature control unit in the same rack unit U2, the carrying distance between these units can be shortened, thereby reducing the carrying time. Moreover, since the transfer of each wafer W to the hydrophobicity rendering unit or temperature control unit becomes unnecessary in the COT layer B4, the configuration of the carrying route can be further facilitated.

Now, the case where only the temperature control unit is provided in the rack unit U2 and the hydrophobicity rendering unit is provided in the COT layer B4 is considered. In this case, upon performing the hydrophobicity rendering process, each wafer W is carried along a route from the transfer stage TRS1 (TRS2), through the hydrophobicity rendering unit TRS1 (TRS2) of the rack unit U1 in the COT layer B4, to the temperature control unit CPL4 of the rack unit U2. Thus, the carrying processes of the wafer W are increased between the rack unit U2 and the rack unit U1, thus lengthening the carrying distance, and resulting in degradation of carrying efficiency.

According to the present invention, by providing the hydrophobicity rendering unit and the temperature control unit in the rack unit U2, other modules can be incorporated in the rack unit U1 of the COT layer B4 or BCT layer B3 for that saved space. Additionally, in order to enhance the throughput, four rows of heating units should be arranged in the unit blocks B3 to B5 for respectively forming coating films. However, the above arrangement can meet such a requirement, thus further enhancing the total throughput while controlling upsizing.

In the aforementioned apparatus, the transfer arm C may be configured such that it can access the respective sections of the rack unit U2, i.e., the transfer stages TRS1, TRS2 and temperature control units CPL3 to 5, so that it can be moved directly from the carrier block S2 to the BCT layer B3 or COT layer B4.

Figure 11:
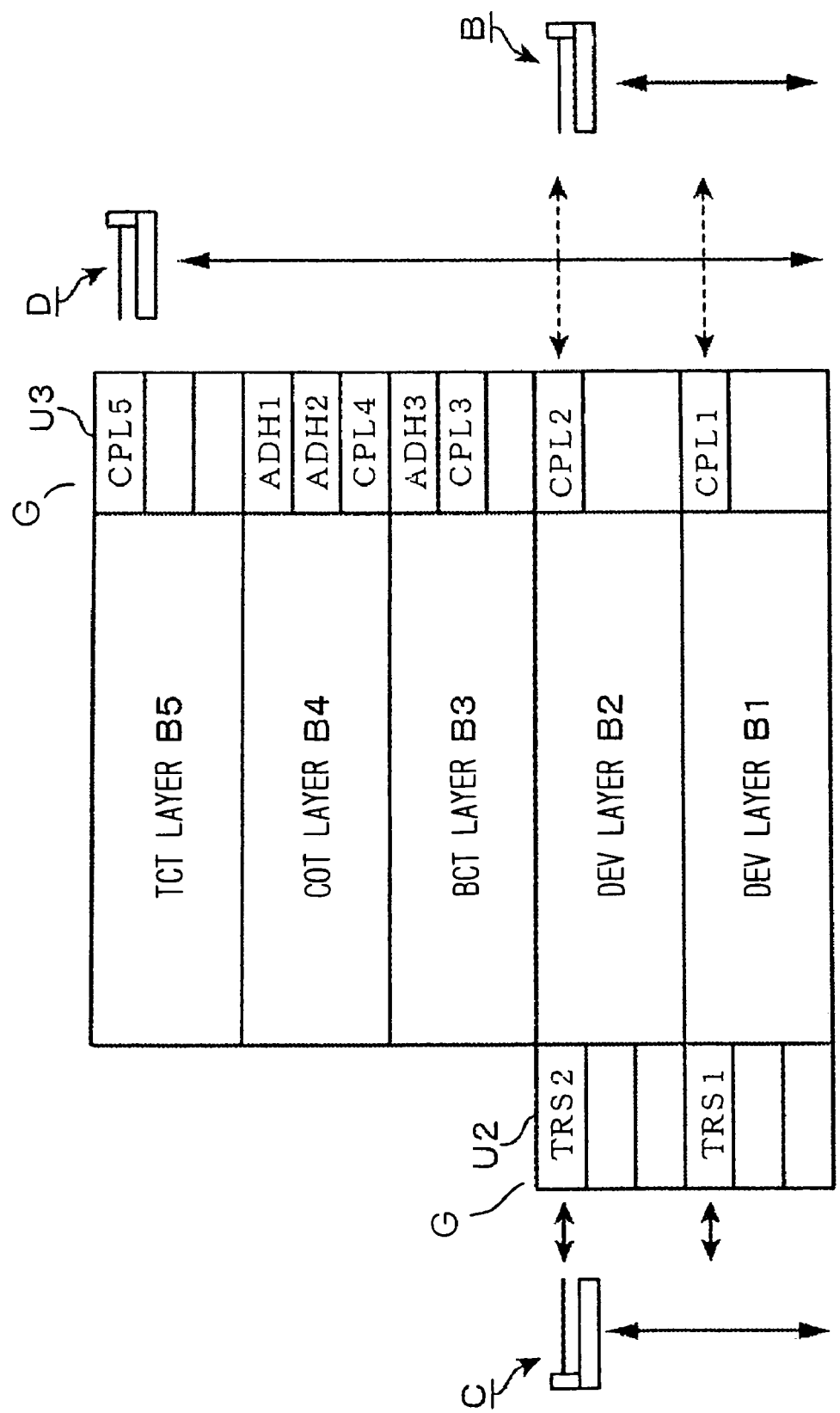
FIG. 11 is a side cross section showing another example of the coating and developing apparatus.

Alternatively, in the present invention described above, as shown in FIG. 11, a group of transferring sections for transferring each wafer W between the unit blocks B1, B2 for the developing process and the unit blocks B3 to B5 for forming the plurality of coating layers may be provided in the rack unit U3, rather than provided in the rack unit U2. In addition, the transfer arm D may be provided, rather than in the rack unit U2, at a position from which it can access the respective sections of the rack unit U3.

In this case, the transfer stages TRS1, TRS2, as transfer sections for the carrier block, adapted to transfer each wafer W between the carrier block S1 and the DEV layers B1, B2 are provided in the rack unit U2, while in the rack unit U3 the temperature control units CPL1, CPL2 are provided, as transfer sections for the interface block, which are adapted to transfer each wafer W between the interface block S3 and the unit blocks B1, B2 for the developing process. The temperature control unit CPL3 and the hydrophobicity rendering unit ADH3 are provided at positions respectively corresponding to the BCT layer B3 of the rack unit U3, the temperature control unit CPL4 and the hydrophobicity rendedring unit ADH1, ADH2 are provided at positions respectively corresponding to the COT layer B4, and the temperature control unit CPL5 is provided at a position corresponding to the TCT layer B5.

Each wafer W carried in the DEV layer B1 (B2) via the transfer stage TRS1 (TRS2) of the rack unit U2 from the carrier block S1 is carried into the transfer section CPL1 (CPL2) of the rack unit U3 due to action of the main arm A1 (A2) of the DEV layer B1 (B2). Then, the wafer W is carried by the transfer arm D into a selected one of the unit blocks B3 to B5 for forming coating films. Among the unit blocks B3 to B5 for forming coating films, each wafer W is transferred by the transfer arm D via the temperature control units CPL3 to CPL5 of the rack unit U3.

The wafer W having coating films formed thereon is then carried into the temperature control unit CPL1 (CPL2) via the temperature control unit CPL3 to CPL5 of the rack unit U3, and is then carried into the exposing apparatus S4 by the interface arm B. After exposed, the wafer W is carried by the interface arm B into the DEV layer B1 (B2) through the temperature control unit CPL1 (CPL2) of the rack unit U3.

In this example, the interface arm B may be configured such that it can access the respective sections of the rack unit U3. As such each wafer W can be transferred directly to the interface arm B via each of the transfer sections of the rack unit U3 corresponding to a selected unit block for forming a coating film, which coats a chemical liquid for the last coating film prior to the exposing process.

In the embodiment described above, while one example in which the transfer of the wafer W between the carrier block S1 and the interface block S3 is performed only through the unit blocks B1, B2 for the developing process has been explained, the transfer of the wafer W between the carrier block S1 and the interface block S3 may be performed via at least one of the unit blocks B3 to B5 for forming coating films.

Figure 12:
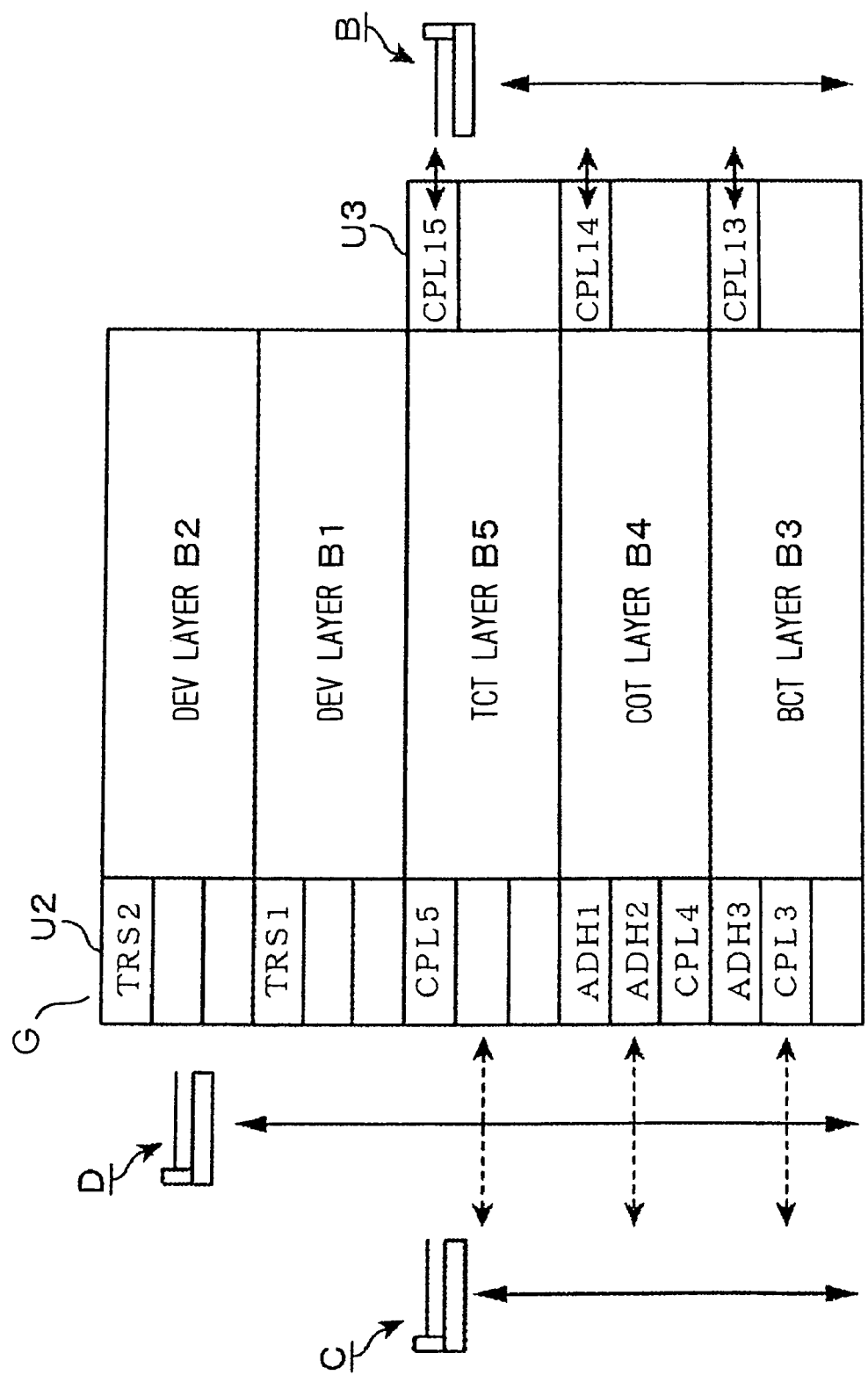
FIG. 12 is a side cross section showing still another example of the coating and developing apparatus.

As shown in FIG. 12, the unit blocks are layered successively in the order of BCT layer B3, COT layer B4, TCT layer B5, DEV layer B1 and DEV layer B2 from below, and transfer sections each adapted to transfer a wafer W between the carrier block S1 and the interface block S3 are provided in the unit blocks B3 to B5 for forming coating films, while the transfer sections are not provided in the unit blocks B1, B2 for the developing process. In this case, for example, each of the unit blocks B1 to B5 includes a group of transfer sections at an area adjacent to, for example, the carrier block S1, and the transfer arm D is configured such that it can access each of the group of transfer sections. Further, the BCT layer B3, COT layer B4 and TCT layer B5 respectively have temperature control units CPL3, CPL4, CPL5 in the rack unit U2, each of the temperature control units also adapted to serve as a transfer section for the carrier block. Additionally, in the rack unit U3, temperature control units CPL13, CPL14, CPL15 are provided, each of which also serves as a transfer section for the interface block, while in the rack unit U2, transfer stages TRS1, TRS2 are provided, respectively corresponding to the DEV layers B1, B2.

In this example, each wafer W in the carrier block S1 is carried into the temperature control unit CPL3 of the rack unit U2 in the BCT layer B5 upon forming a first antireflection film. Otherwise, in the case where the first antireflection film is not formed, each wafer W is carried into, for example, the temperature control unit CPL4 of the rack unit U2 in the COT layer B4. After carried into the unit block for forming a predetermined coating film, the wafer W is further carried into the exposing apparatus S4 due to action of the interface arm B via any one of the temperature control units CPL13 to CPL15 of the rack unit U3.

The wafer W after being exposed is carried into the unit block B3 to B5 via any one of the temperature control units CPL13 to CPL15 of the rack unit U3, and is then carried into the DEV layer B1 (B2) via the main arm A3 to A5 of the corresponding unit block B3 to B5, temperature control unit CPL3 to CPL5 of the rack unit U2, transfer arm D and then transfer stage TRS1 (TRS2), and a developing process is performed in the DEV layer B1 (B2). The wafer W after developed is carried into any one of the temperature control units CPL3 to CPL5 via the transfer stage TRS1 (TRS2) of the rack unit U2 and then transfer arm D, and is then transferred to the carrier block S1 from the temperature control unit.

In this example, the transfer sections for the interface block may be provided in all of the unit blocks B1 to B5. Alternatively, the transfer section for the carrier block and the transfer section for the interface block may be provided in at least one of the unit blocks B3 to B5 for forming coating films, or otherwise, these transfer sections may be provided in different unit blocks for forming coating films.

Figure 13:
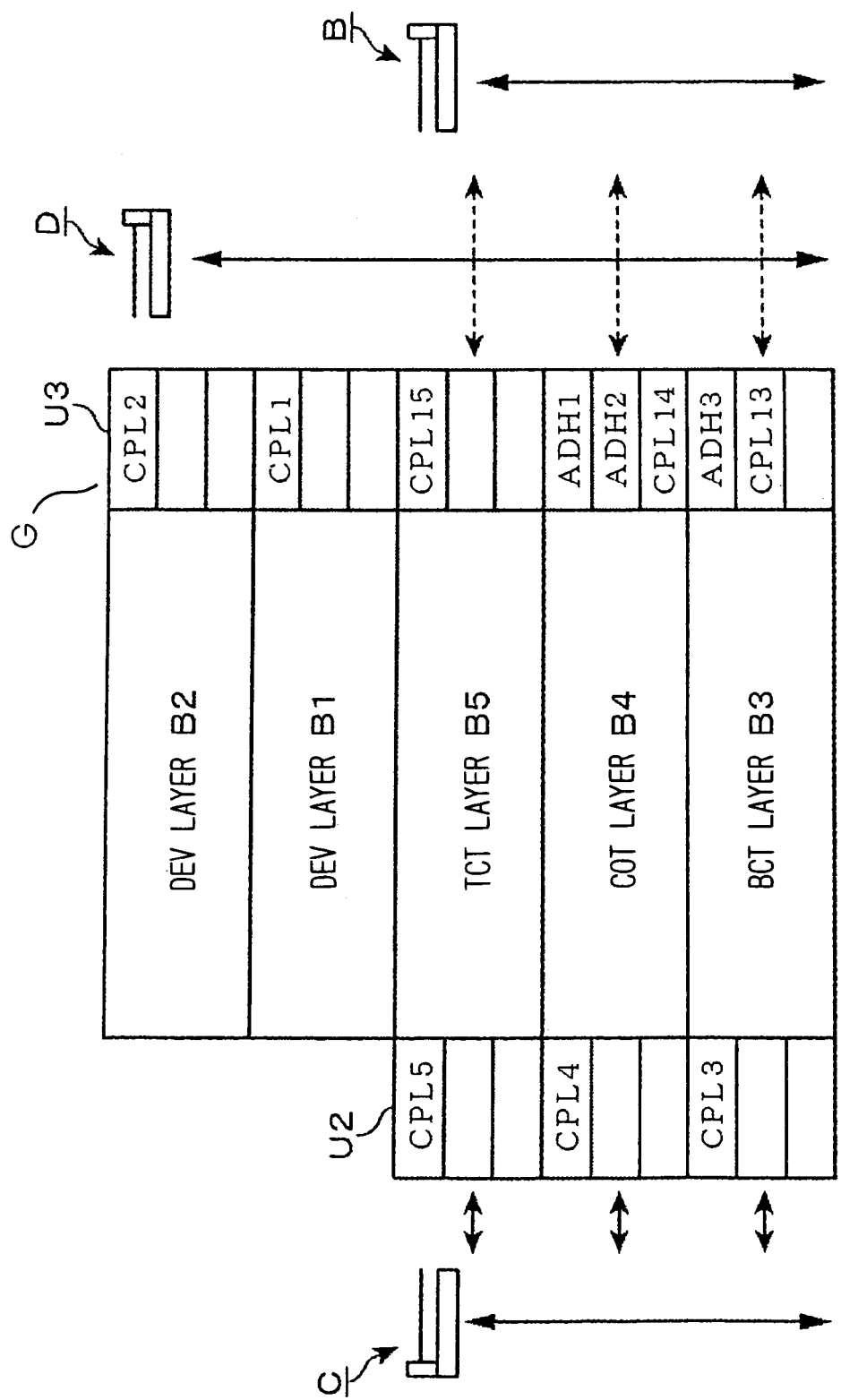
FIG. 13 is a side cross section showing still yet another example of the coating and developing apparatus.

In this example, among all of the unit blocks B1 to B5 the wafer W may be transferred only by a combination of the group G of transfer sections provided on the side of the interface block 53 and the transfer arm D which can access the group G of such transfer sections. In this case, assume that, for example, as shown in FIG. 13, each of the unit blocks B1 to B5 includes the group G of transfer sections in an area adjacent to, for example, the interface block S3, and the transfer arm D is configured such that it can access each section of the group G of transfer sections. In addition, for example, the temperature control units CPL3, CPL4, CPL5 each adapted to serve as a transfer section for the carrier block are provided in the rack unit U2, respectively corresponding to the BCT layer B3, COT layer B4 and TCT layer B5, while in the rack unit U3, the temperature control units CPL13, CPL14, CPL15 each adapted to serve as a transfer section for the interface block are provided respectively. Furthermore, the temperature control units CPL1, CPL2 are provided in the rack unit U3, respectively corresponding to the DEV layers B1, B2. In addition, in the rack unit U3, the hydrophobicity rendering unit ADH3 is provided at a position corresponding to the BCT layer B3 and the hydrophobicity rendering units ADH1, ADH2 are provided at positions respectively corresponding to the COT layer B4.

In this example, each wafer W in the carrier block S1 is carried into the BCT layer B3 via the temperature control unit CPL3 of the rack unit U2 in the BCT layer B3. Alternatively, in the case where the first antireflection film is not formed, each wafer W is carried into the COT layer B4 via the temperature control unit CPL4 of the rack unit U2 in the COT layer B4. Thereafter, the wafer is carried into a selected unit block for forming a predetermined coating film, and is then carried into the exposing apparatus S4 due to the interface arm B via any one of the temperature control units CPL13 to CPL15 of the rack unit U3.

The wafer W after exposed is carried into the DEV layer B1 (B2) via any one of the temperature control unit CPL13 to CPL15, transfer arm D and then the temperature control unit CPL1 (CPL2), and a developing process is carried out in the DEV layer B1 (B2). Furthermore, the wafer W after being developed is carried along a route from the temperature control units CPL1 (CPL2) of the rack unit U3, through the transfer arm D, to any one of the temperature control units CPL13 to CPL15, and then returned to the carrier block S1 via any one of the temperature control units CPL3 to CPL5 of the rack unit U2, passing through the corresponding unit block B3 to B5.

In this example, the transfer sections for the interface block may be provided in all of the unit blocks B1 to B5. Alternatively, the transfer section for the carrier block and the transfer section for the interface block may be provided in at least one of the unit blocks B3 to B5 for forming coating films, or otherwise, these transfer sections may be provided in different unit blocks for forming coating films.

Figure 14:
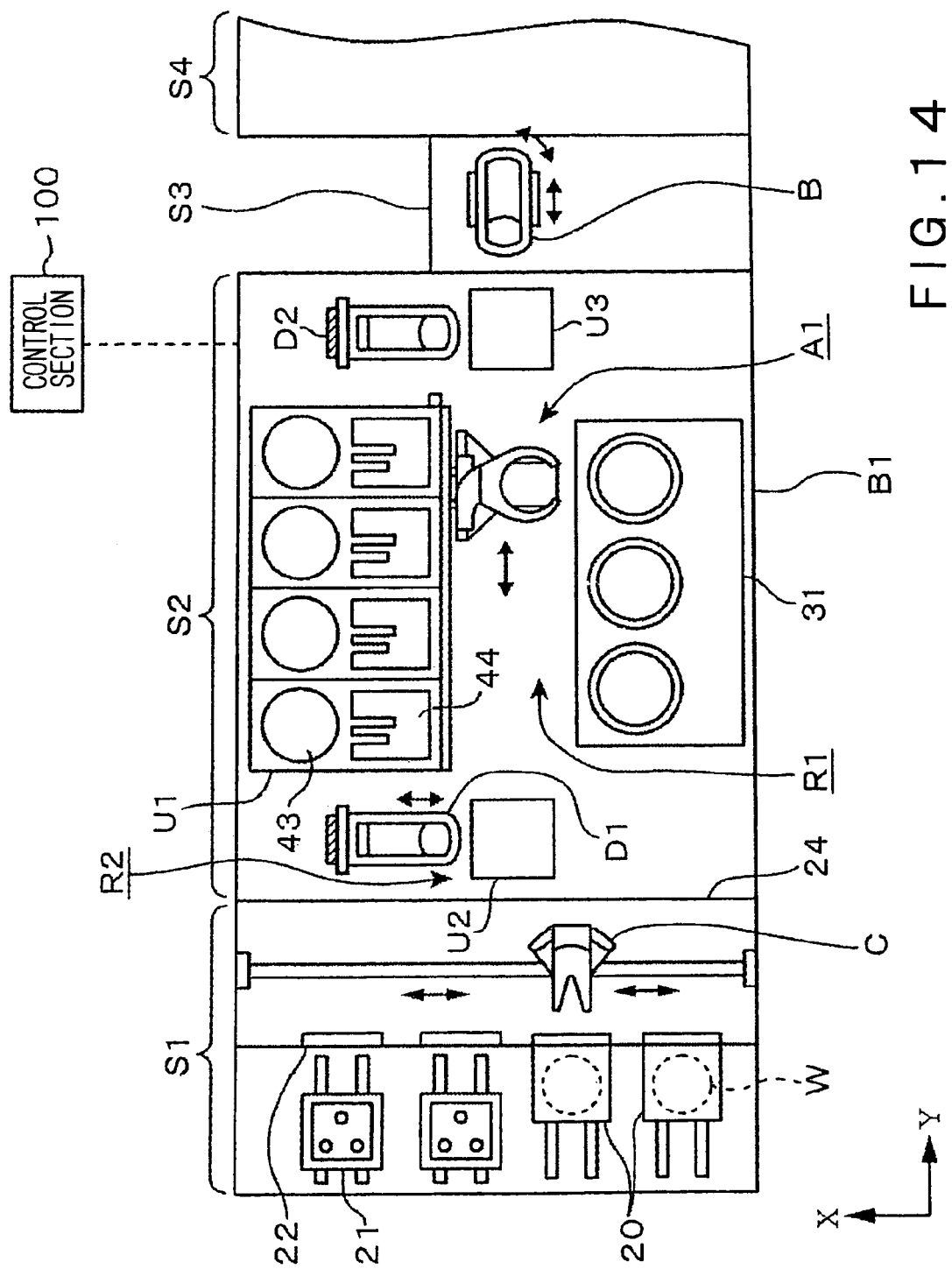
FIG. 14 is a side cross section showing still yet another example of the coating and developing apparatus.
Figure 15:
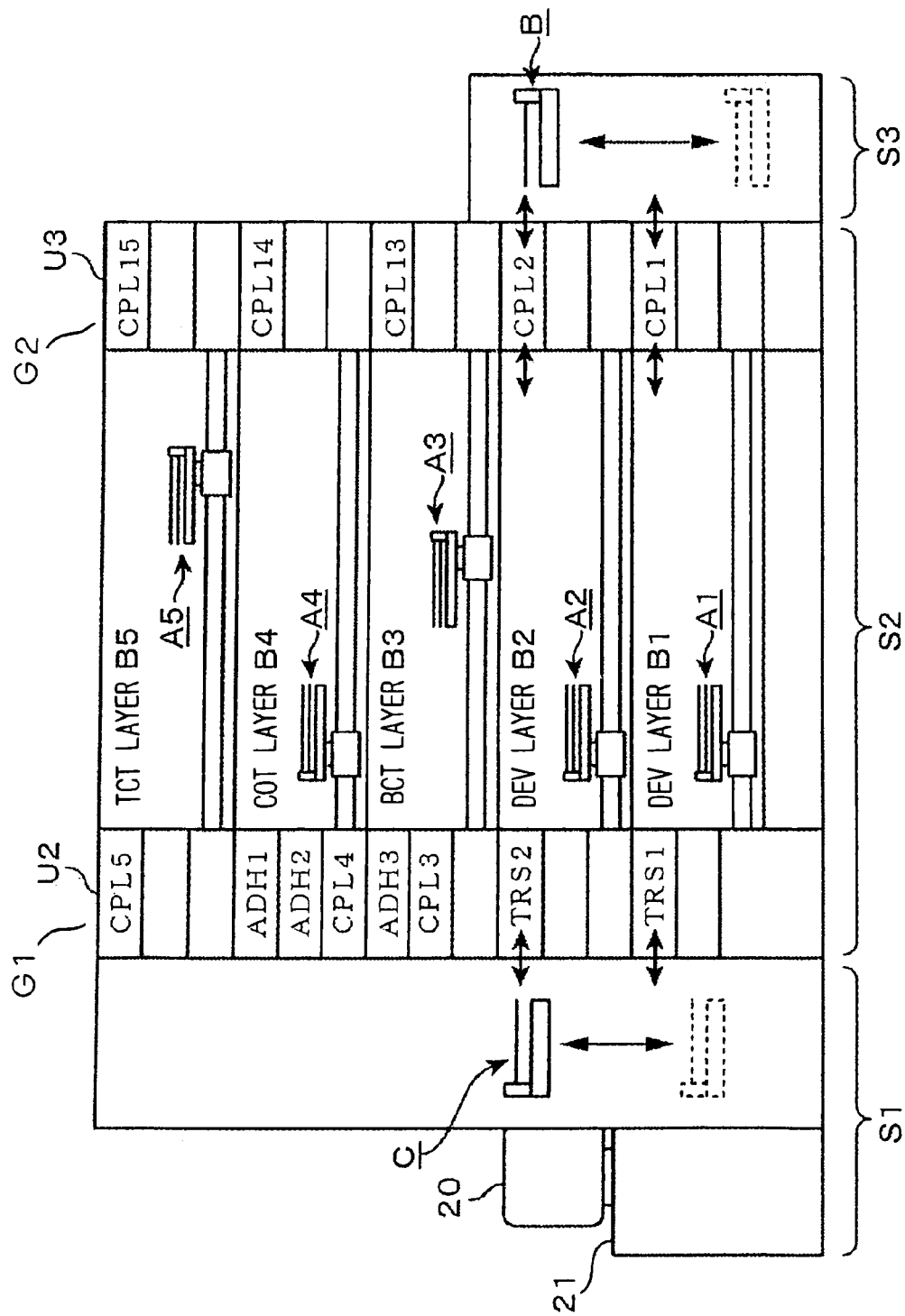
FIG. 15 is a side cross section showing the coating and developing apparatus shown in FIG. 14.
Figure 16:
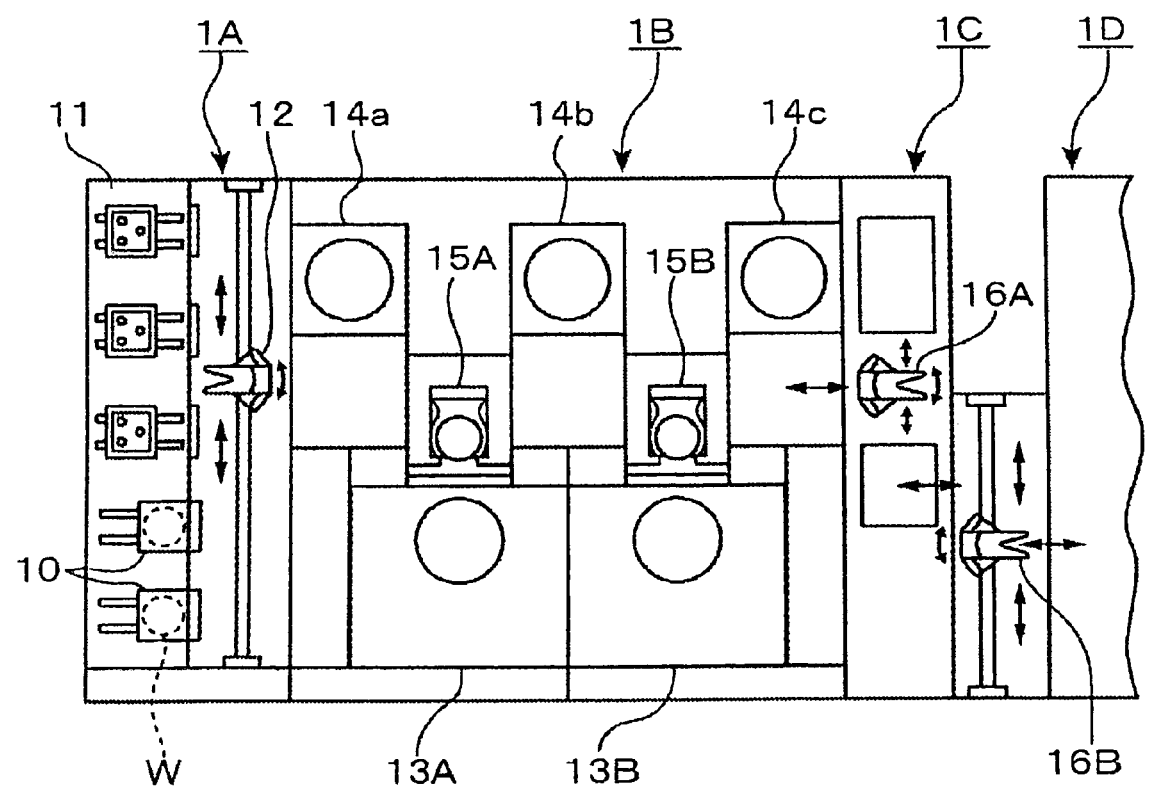
FIG. 16 is a plan view showing a conventional coating and developing apparatus.

Furthermore, in the present invention, as shown in FIGS. 14 and 15, the transfer of the wafer W between all of the unit blocks B1 to B5 may be performed by a first group G1 of transfer sections provided on the side of the carrier block S1 and a first transfer arm D1 which can access the first group G1 of transfer sections, or otherwise, it may be performed by a second group G2 of transfer sections provided on the side of the interface block S3 and a second transfer arm D2 which can access the second group G2 of transfer sections.

In this case, for example, each of the unit blocks B1 to B5 includes the first group G1 of transfer sections in the rack unit U2, and the first group G1 of transfer sections includes transfer stages TRS1, TRS2 provided at positions respectively corresponding to the DEV layers B1, B2, the temperature control unit CPL3 and hydrophobicity rendering unit ADH3 provided at positions respectively corresponding to the BCT layer B3, the temperature control unit CPL4 and hydrophobicity rendering units ADH1, ADH2 provided at positions respectively corresponding to the COT layer B4, and the temperature control unit CPL5 provided at a position corresponding to the TCT layer B5. In the rack unit U3, the second group G2 of transfer sections are provided, and the second group G2 includes the temperature control units CPL1, CPL2 provided positions respectively corresponding to the DEV layers B1, B2, the temperature control unit CPL13 provided at a position corresponding to the BCT layer B3, the temperature control unit CPL 14 provided at a position corresponding to the COT layer B4, and the temperature control unit CPL15 provided at a position corresponding to the TCT layer B5. In this case, for example, the transfer stages TRS1, TRS2 in the rack unit U2 correspond to the transfer sections for the carrier block, while the temperature control units CPL1, CPL2 in the rack unit U3 correspond to the transfer sections for the interface block, respectively. It can be appreciated that the hydrophobicity rendering units ADH1 to ADH3 may be provided in the rack unit 3.

In the case of forming the first antireflection film, each wafer W in the carrier block S1 is carried into the BCT layer B3 along a route from the transfer stage TRS1 (TRS2) of the DEV layers B1, B2 to the temperature control unit COL3 of the rack unit U2 in the BCT layer B3. Alternatively, in the case where the first antireflection film is not formed, for example, each wafer W is carried into the hydrophobicity rendering unit ADH1 (ADH2) of the rack unit U2 in the COT layer B4 via the transfer stage TRS1 (TRS2) of the DEV layer B1 (B2). Thereafter, the wafer W is carried into a selected unit block for forming a predetermined coating film via any one of the first group of transfer sections of the rack unit U2 or second group of transfer sections of the rack unit U3, and is then carried along a route from the temperature control unit CPL1 (CPL2) of the rack unit U3, through the interface arm B, to the exposing apparatus S4.

On the other hand, the wafer after being exposed is carried into, for example, the DEV layer B1 (B2) via the temperature control unit CPL1 (CPL2), and an exposing process is performed in the DEV layer B1 (B2). Thereafter, the wafer W is returned to the carrier block S1 via the transfer stage TRS1 (TRS2) of the rack unit U2.

It can be appreciated that in the present invention the hydrophobicity rendering process may be performed upon forming the first antireflection film is formed. The hydrophobicity rendering process upon forming the first antireflection film may be performed in the hydrophobicity rendering unit ADH1 or ADH2. In addition, the hydrophobicity rendering unit upon coating a resist film may be performed in the hydrophobicity rendering unit ADH3.

It can also be appreciated that in the present invention the unit blocks for the developing process may be a monolayer unit and the unit blocks for forming coating films may be arranged in the order of the TCT layer, COT layer and BCT layer from below. In addition, one or more transfer sections may be provided in the rack units U2, U3 for each unit block.

Since each temperature control unit serves a function similar to the cooling units COL provided in the DEV layers B1, B2, all the temperature control units may be replaced by transfer sections in the rack unit U2, U3, and cooling units may be provided in each unit block. In addition, temperature control units may be provided in the rack units U2, U3, while cooling units may be provided in the respectively corresponding unit blocks.

In the present invention, the transfer sections of the rack unit U2 which are accessible to the transfer arm C may be those capable of transferring each wafer W between the transfer arm C and one or more of the unit blocks. Meanwhile, the transfer sections of the rack unit U3 which are accessible to the interface arm B may be those capable of transferring each wafer W between the interface arm B and one or more of the unit blocks.

Furthermore, in the present invention, in the case where the hydrophobicity rendering unit is provided in the rack unit U2, each wafer W may be directly transferred between the transfer arm C and the hydrophobicity rendering unit. In this case, the transfer arm C is configured to be of a shape as shown in FIG. 10.

Additionally, for the modules in the DEV layers B1, B2, each wafer W may be carried by commonly using only the main arm A1, or otherwise the rack units U1, U2, U3 may be provided only in any one of the unit blocks B1, B2. Furthermore, it can be appreciated that the present invention is not limited to semiconductor wafers, but may be applied to a coating and developing apparatus adapted to process substrates, such as glass substrates for liquid crystal displays (LCD substrates).

The invention claimed is:

1. A coating and developing apparatus including a processing block adapted to receive a substrate from a carrier on a carrier block and form coating films including a resist film, wherein the substrate having coating films formed in the processing block thereon is carried into an exposing apparatus via an interface block, and the substrate after exposed and returned via the interface block is developed in the processing block and then transferred to the carrier block, wherein
    (a) the processing block comprises unit blocks for forming a plurality of coating films and unit blocks for a developing process, which are layered with one another, wherein
    (b) the unit blocks for forming coating films comprise unit blocks for coating a resist liquid on each substrate, and unit blocks for coating a chemical liquid for forming an antireflection film on the substrate, wherein
    (c) each of the unit blocks for forming coating films and the unit blocks for a developing process comprises a liquid processing unit for coating a chemical liquid on the substrate, a heating unit for heating the substrate, and a carrying means for each unit block, which is adapted to carry the substrate between the liquid processing unit and the heating unit, and wherein
    (d) a group of transfer sections, comprising transfer sections adapted to transfer the substrate to the carrying means of each unit block and hydrophobicity rendering units layered with the transfer sections and adapted to provide a hydrophobicity rendering process to the substrate, is provided on the side of the carrier block of the unit blocks for forming coating films and unit blocks for a developing process, and a substrate transfer means adapted to transfer the substrate between the transfer sections and the hydrophobicity rendering units is further provided.

2. The coating and developing apparatus according to claim 1, wherein the group of transfer sections includes a temperature control unit on which a substrate prior to forming coating films thereon is placed and which adjusts the temperature of the substrate to a temperature at which a process of coating a chemical liquid for forming a coating film is performed.

3. The coating and developing apparatus according to claim 2, wherein the temperature control unit includes a first temperature control plate on which a substrate is placed and which adjusts roughly the temperature of the substrate to a first temperature, and a second temperature control plate on which the substrate is placed and which adjusts more precisely the temperature of the substrate.

4. The coating and developing apparatus according to claim 3, wherein the temperature of the second temperature control plate is controlled with a liquid flowing in a pipe, with the temperature of the liquid being adjusted to a predetermined temperature, and wherein the first temperature control plate is attached to includes a heating pipe adapted to transfer the temperature of the liquid to the first temperature control plate, the heating pipe being in connection with a pipe through which the liquid flows.

5. A coating and developing apparatus including a processing block adapted to receive a substrate from a carrier on a carrier block and form coating films including a resist film, wherein the substrate having coating films formed in the processing block thereon is carried into an exposing apparatus via an interface block, and the substrate after exposed and returned via the interface block is developed in the processing block and then transferred to the carrier block, wherein
    (a) the processing block comprises unit blocks for forming a plurality of coating films and unit blocks for a developing process, which are layered with one another, wherein
    (b) the unit blocks for forming coating films comprise unit blocks for coating a resist liquid on each substrate, and unit blocks for coating a chemical liquid for forming an antireflection film on the substrate, wherein
    (c) each of the unit blocks for forming coating films and the unit blocks for a developing process comprises a liquid processing unit for coating a chemical liquid on the substrate, a heating unit for heating the substrate, and a carrying means for each unit block, which is adapted to carry the substrate between the liquid processing unit and the heating unit, and wherein
    (d') a group of transfer sections, comprising transfer sections adapted to transfer the substrate to the carrying means of each unit block and hydrophobicity rendering units layered with the transfer sections and adapted to provide a hydrophobicity rendering process to the substrate, is provided on the side of the interface block of the unit blocks for forming coating films and unit blocks for a developing process, and a substrate transfer means adapted to transfer the substrate between the transfer sections and the hydrophobicity rendering units is further provided.

6. The coating and developing apparatus according to claim 5, wherein the group of transfer sections includes a temperature control unit on which a substrate prior to forming coating films thereon is placed and which adjusts the temperature of the substrate to a temperature at which a process of coating a chemical liquid for forming a coating film is performed.

7. The coating and developing apparatus according to claim 6, wherein the temperature control unit includes a first temperature control plate on which a substrate is placed and which adjusts roughly the temperature of the substrate to a first temperature, and a second temperature control plate on which the substrate is placed and which adjusts more precisely the temperature of the substrate.

8. The coating and developing apparatus according to claim 7, wherein the temperature of the second temperature control plate is controlled with a liquid flowing in a pipe, with the temperature of the liquid being adjusted to a predetermined temperature, and wherein the first temperature control plate is attached to a heating pipe adapted to transfer the temperature of the liquid to the first temperature control plate, the heating pipe being in connection with a pipe through which the liquid flows.

9. A coating and developing method of using a coating and developing apparatus including a processing block adapted to receive a substrate from a carrier on a carrier block and form coating films including a resist film, wherein the substrate having coating films formed in the processing block thereon is carried into an exposing apparatus via an interface block, and the substrate after exposed and returned via the interface block is developed in the processing block and then transferred to the carrier block, wherein (a) the processing block comprises unit blocks for forming a plurality of coating films and unit blocks for a developing process, which are layered with one another, wherein (b) the unit blocks for forming coating films comprise unit blocks for coating a resist liquid on each substrate, and unit blocks for coating a chemical liquid for forming an antireflection film on the substrate, wherein (c) each of the unit blocks for forming coating films and the unit blocks for a developing process comprises a liquid processing unit for coating a chemical liquid on the substrate, a heating unit for heating the substrate, and a carrying means for each unit block, which is adapted to carry the substrate between the liquid processing unit and the heating unit, and wherein (d) a group of transfer sections, comprising transfer sections adapted to transfer the substrate to the carrying means of each unit block and hydrophobicity rendering units layered with the transfer sections and adapted to provide a hydrophobicity rendering process to the substrate, is provided on the side of the carrier block of the unit blocks for forming coating films and unit blocks for a developing process, and a substrate transfer means adapted to transfer the substrate between the transfer sections and the hydrophobicity rendering units is further provided, the method comprising the steps of:

carrying the substrate which has been subjected to a hydrophobicity rendering process in the hydrophobicity rendering unit into the unit block for forming a coating film, and coating a resist liquid on the substrate; and providing a developing process, in the unit block for a developing process, to the substrate which has been coated with the resist liquid and exposed.

\* \* \* \* \*

UNITED STATES PATENT AND TRADEMARK OFFICE
CERTIFICATE OF CORRECTION

PATENT NO. : 7,661,894 B2
APPLICATION NO. : 11/523015
DATED : February 16, 2010
INVENTOR(S) : Matsuoka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 820 days.

Signed and Sealed this

Thirtieth Day of November, 2010

David J. Kappos
*Director of the United States Patent and Trademark Office*